(12) United States Patent
Yamazaki et al.

(10) Patent No.: US 8,034,182 B2
(45) Date of Patent: Oct. 11, 2011

(54) APPARATUS FOR FORMING A FILM AND AN ELECTROLUMINESCENCE DEVICE

(75) Inventors: Shunpei Yamazaki, Tokyo (JP); Hideaki Kuwabara, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 453 days.

(21) Appl. No.: 10/826,920

(22) Filed: Apr. 19, 2004

(65) Prior Publication Data

US 2005/0005848 A1 Jan. 13, 2005

(30) Foreign Application Priority Data

Apr. 25, 2003 (JP) .................................. 2003-121313

(51) Int. Cl.
 *C23C 16/00* (2006.01)
(52) U.S. Cl. ........................ 118/726; 118/719
(58) Field of Classification Search .................. 118/719, 118/726
 See application file for complete search history.

(56) References Cited

U.S. PATENT DOCUMENTS

| | | | |
|---|---|---|---|
| 2,435,997 A | 2/1948 | Bennett | |
| 3,931,490 A | 1/1976 | Grothe et al. | |
| 4,023,523 A | 5/1977 | Ing | |
| 4,187,801 A | 2/1980 | Monk | |
| 4,627,989 A | 12/1986 | Feuerstein et al. | |
| 4,668,480 A * | 5/1987 | Fujiyashu et al. ............ | 118/719 |
| 4,897,290 A | 1/1990 | Terasaka et al. | |
| 5,258,325 A | 11/1993 | Spitzer et al. | |
| 5,429,884 A | 7/1995 | Namiki et al. | |
| 5,532,102 A * | 7/1996 | Soden et al. ................... | 430/128 |
| 5,817,366 A | 10/1998 | Arai et al. | |
| 6,053,981 A * | 4/2000 | Salokatve et al. ............. | 118/726 |
| 6,090,207 A * | 7/2000 | Knauss et al. ................. | 118/715 |
| 6,132,280 A | 10/2000 | Tanabe et al. | |
| 6,179,923 B1 * | 1/2001 | Yamamoto et al. ........... | 118/719 |
| 6,237,529 B1 | 5/2001 | Spahn | |
| 6,244,212 B1 | 6/2001 | Takacs et al. | |
| 6,326,726 B1 | 12/2001 | Mizutani et al. | |
| 6,403,392 B1 | 6/2002 | Burrows et al. | |
| 6,444,043 B1 * | 9/2002 | Gegenwart et al. ........... | 118/726 |
| 6,482,752 B1 | 11/2002 | Yamazaki et al. | |
| 6,641,674 B2 * | 11/2003 | Peng .............................. | 118/727 |
| 6,696,096 B2 | 2/2004 | Tsubaki et al. | |
| 6,828,727 B2 | 12/2004 | Yamazaki | |
| 7,429,300 B2 | 9/2008 | Kido et al. | |
| 2001/0006827 A1 * | 7/2001 | Yamazaki et al. .............. | 438/30 |
| 2001/0009154 A1 | 7/2001 | Nguyen et al. | |
| 2002/0009538 A1 * | 1/2002 | Arai ............................... | 427/66 |
| 2002/0011205 A1 | 1/2002 | Yamazaki et al. | |
| 2002/0030443 A1 * | 3/2002 | Konuma et al. ............... | 313/504 |
| 2002/0197760 A1 | 12/2002 | Yamazaki et al. | |

(Continued)

FOREIGN PATENT DOCUMENTS

EP 1 167 566 1/2002

(Continued)

*Primary Examiner* — Karla Moore
(74) *Attorney, Agent, or Firm* — Fish & Richardson P.C.

(57) ABSTRACT

A device having three evaporation sources and a unit for moving the respective evaporation sources in one chamber is used, whereby it becomes possible to increase efficiency of use of an evaporation material. Consequently, manufacturing cost can be reduced, and a uniform thickness can be obtained over an entire surface of a substrate even in the case in which a large area substrate is used.

24 Claims, 16 Drawing Sheets

U.S. PATENT DOCUMENTS

| | | | |
|---|---|---|---|
| 2003/0122140 A1 | 7/2003 | Yamazaki et al. |
| 2003/0124764 A1 | 7/2003 | Yamazaki et al. |
| 2003/0137325 A1 | 7/2003 | Yamazaki et al. |
| 2003/0162314 A1 | 8/2003 | Yamazaki et al. |
| 2003/0194484 A1 | 10/2003 | Yamazaki et al. |
| 2003/0221620 A1 | 12/2003 | Yamazaki |
| 2003/0227253 A1 | 12/2003 | Seo et al. |
| 2004/0031442 A1 | 2/2004 | Yamazaki et al. |
| 2004/0035360 A1 | 2/2004 | Yamazaki et al. |
| 2004/0040504 A1 | 3/2004 | Yamazaki et al. |
| 2004/0123804 A1 | 7/2004 | Yamazaki et al. |
| 2004/0139914 A1 | 7/2004 | Yamazaki et al. |
| 2004/0216673 A1 | 11/2004 | Sakata et al. |
| 2005/0093436 A1 | 5/2005 | Yamazaki |
| 2005/0126493 A1 | 6/2005 | Jeong |
| 2008/0299296 A1 | 12/2008 | Kido et al. |
| 2009/0170227 A1 | 7/2009 | Yamazaki et al. |

FOREIGN PATENT DOCUMENTS

| | | | |
|---|---|---|---|
| EP | 1260605 A1 | | 11/2002 |
| JP | 63282190 A | * | 11/1988 |
| JP | 06-088233 | | 3/1994 |
| JP | 06-228740 | | 8/1994 |
| JP | 06-299353 | | 10/1994 |
| JP | 09143697 A | * | 6/1997 |
| JP | 10-041069 | | 2/1998 |
| JP | 2000223269 A | * | 8/2000 |
| JP | 2001-093667 | | 4/2001 |
| JP | 2001-247959 | | 9/2001 |
| JP | 2002-060926 | | 2/2002 |
| JP | 2002-080961 | | 3/2002 |
| JP | 2002-208477 | | 7/2002 |
| JP | 2002348659 A | | 12/2002 |
| JP | 2003-115379 | | 4/2003 |
| JP | 2003-129224 | | 5/2003 |
| JP | 2004-035964 | | 2/2004 |
| JP | 2004-107762 | | 4/2004 |
| JP | 2004-149846 | | 5/2004 |
| JP | 2004-315898 | | 11/2004 |
| JP | 2005-515304 | | 5/2005 |
| WO | WO01-31081 | | 5/2001 |
| WO | WO-03/062486 | | 7/2003 |

* cited by examiner

US 8,034,182 B2

APPARATUS FOR FORMING A FILM AND AN ELECTROLUMINESCENCE DEVICE

TECHNICAL FIELD TO WHICH THE INVENTION BELONGS

The present invention relates to a film forming apparatus employed for forming a film of a material capable of forming a film by deposition (referred to herein below as a deposition material) and a production apparatus comprising such a film forming apparatus. In particular, the present invention relates to an evaporation apparatus in which a film is formed by evaporating a deposition material from a deposition source provided opposite to a substrate. Besides, the present invention also relates to an electroluminescence device and method of manufacturing thereof.

RELATED ART

Light-emitting elements using organic compounds featuring small thickness and weight, fast response, DC low-voltage drive, and the like, as light-emitting substances have been expected to find application in flat panel displays of the next generation. In particular, display devices in which light emitting elements are disposed as a matrix have been considered to be superior to the conventional liquid-crystal displays in that they have a wide viewing angle and excellent visibility.

As for the light emission mechanism of light-emitting elements, it is thought that electrons introduced from a cathode and holes introduced from an anode recombinate in an organic compound layer at the light-emitting center and form molecular excitons under the effect of the voltage applied to a pair of electrodes sandwiching a layer containing the organic compound and energy is then released and light is emitted when the molecular excitons return to a ground state. Singlet excitation and triplet excitation are known as excited states and light emission is considered to be possible via any excited state.

In light-emitting devices formed by arranging such light-emitting elements as a matrix, drive methods such as a passive matrix drive (simple matrix type) and active matrix drive (active matrix type) can be used. However, when the pixel density is increased, the active matrix type, in which a switch is provided for each pixel (or 1 dot) is considered to be advantageous because a low-voltage drive is possible.

Further, a layer comprising an organic compound has a multilayer structure, typically in the form of "hole transfer layer/light-emitting layer/electron transfer layer". EL materials forming an EL layer are generally classified into low-molecular (monomer) materials and high-molecular (polymer) materials, and low-molecular materials are employed to form films in deposition apparatuses.

The conventional deposition apparatuses have a substrate disposed in a substrate holder and comprise a container (or a deposition boat) having an EL material, that is, a deposition material, introduced therein, a shutter preventing the sublimated EL material from rising, and a heater for heating the EL material located inside the container. The EL material heated with the heater is sublimated and forms a film on the rotating substrate. In order to conduct uniform film formation in this process, the distance between the substrate and the container is set to 1 m or more.

With the conventional deposition apparatus or deposition method, when an EL layer was formed by deposition, almost the entire sublimated EL material adhered to the inner walls, shutter, or adhesion-preventing shield (a protective sheet for preventing the deposition material from adhering to the inner walls of the film forming chamber) of the film forming chamber of the deposition apparatus. For this reason, the utilization efficiency of expensive EL materials in the formation of the EL layer was extremely low, about 1% or less, and the production cost of light-emitting devices was extremely high.

Further, in the conventional deposition apparatuses, the spacing between the substrate and the deposition source was set to 1 m or more in order to obtain a uniform film. Further, a problem associated with substrates with a large surface area is that the film thickness can easily become nonuniform in the central zone and peripheral edges of the substrate. Moreover, because the deposition apparatus has a structure with a rotating substrate, a limitation is placed on the deposition apparatuses designed for substrates with a large surface area.

In addition, if a substrate with a large surface area and a mask for deposition are rotated together after being brought into intimate contact with each other, there is a risk of the displacement occurring between the mask and the substrate. Further, if the substrate or mask is heated during deposition, then dimensions change due to thermal expansion. As a result, the dimensional accuracy and positional accuracy decrease owing to the difference in thermal expansion coefficient between the mask and substrate.

With the foregoing in view, the applicant of the present application has suggested a deposition apparatus (Japanese Laid-Open Patent Applications No. 2001-247959 and 2002-60926) as means for resolving the aforementioned problems.

PROBLEMS ADDRESSED BY THE INVENTION

The present invention provides a production apparatus equipped with a deposition apparatus, which is a production apparatus reducing production cost by increasing the utilization efficiency of EL materials and having excellent uniformity and throughput of EL layer deposition.

Further, the present invention also provides a production apparatus for efficient deposition of EL materials on substrates with a large surface area such as 320 mm×400 mm, 370 mm×470 mm, 550 mm×650 mm, 600 mm×720 mm, 680 mm×880 mm, 1000 mm×1200 mm, 1100 mm×1250 mm, and 1150 mm×1300 mm. Further, the present invention also provides a deposition apparatus for obtaining a uniform film thickness over the entire substrate surface even on a substrate with a large surface area.

MEANS FOR SOLVING THE PROBLEMS

The present invention forms layers containing organic compounds of an electroluminescence element in a three-layer lamination to manufacture a full-color electroluminescence device with the small number of chambers. More specifically, a hole transport layer and an electron transport layer of the three-layer lamination are used as common layers, and only an electroluminescence layer of an electroluminescence element emitting light of red, green, or blue is coated separately for each pixel by one chamber. In other words, the layers containing organic compounds of the electroluminescence element are manufactured by at least three chambers. Evaporation is performed in one chamber in a selective manner to form different three electroluminescence layers. As shown in FIG. 1, three robot arms (moving means) 106a, 106b, and 106c mounted with different evaporation sources move in the inside of one chamber freely to perform film formation in order in a selective manner. Note that, when film formation for one layer ends, a substrate 100 and a mask 113 are spaced apart, alignment of the substrate and the mask is shifted to a film formation position of the next second layer and changed to perform film formation for the next second layer. Then, when the film formation for the second layer ends, the substrate and the mask are spaced apart in the same manner and, film formation for the next third layer is performed after performing alignment of the substrate and the mask.

In addition, while one arm is moved to perform evaporation, the other arms are on standby in installation chambers, and evaporation is performed by alternating in order.

Further, depending upon a pixel arrangement, positions to be evaporated are made different for pixels of R, G, and B. Therefore, alignment of the substrate and the mask is performed for each luminescent color to perform evaporation in order. Separate coating for R, G, and B is performed by shifting a position using an identical mask.

Moreover, it is assumed that the robot arms moving the evaporation sources can move in a Z direction and is capable of rising and falling. In addition, revolution centers of the robot arms may be located in the installation chambers or may be located in the film formation chambers.

A constitution of the invention disclosed in this specification, an example of which is shown in FIG. 1, is an apparatus for forming a film having a load chamber, a conveyance chamber connected to the load chamber, and plural film formation chambers connected to the conveyance chamber, characterized in that the film formation chambers are connected to an evacuation and exhaust treatment chamber that evacuates the film formation chamber and include: aligning means that aligns a mask and a substrate; substrate holding means; means that heats the substrate;

a first evaporation source; means that moves the first evaporation source;

a second evaporation source; means that moves the second evaporation source;

a third evaporation source; and means that moves the third evaporation source.

In the above constitution, the apparatus for forming a film is characterized in that installation chambers are connected to the film formation chambers, and the installation chambers are connected to evacuating and exhausting means that evacuates the installation chambers and have a mechanism for setting an evaporation material in the evaporation source in the installation chamber.

In the above constitution, the apparatus for forming a film is characterized in that the film formation chambers and the installation chambers are connected to the evacuation and exhaust treatment chamber that evacuates the chambers and have means that can introduce a material gas or a cleaning gas.

In the above constitution, the apparatus for forming a film is characterized in that the evaporation sources are movable in an X direction, a Y direction, or a Z direction in the film formation chambers.

In the above constitution, the apparatus for forming a film is characterized in that the film formation chambers have shutters that section the film formation chambers and shield evaporation to the substrate.

In the above constitution, the apparatus for forming a film is characterized in that a sealing chamber is connected to the conveyance chamber, and the sealing chamber is connected to evacuating and exhausting means, which evacuates the sealing chamber, has a mechanism for applying a seal material with an ink jet method in the sealing chamber. Note that, after stacking layers containing organic compounds and a cathode (or anode) with evaporation, a seal layer is formed by the ink jet method without being exposed to the atmosphere. In addition, a protective film consisting of an inorganic insulating film may be formed with a sputtering method before forming the seal layer with the ink jet method.

In sealing of an electroluminescence element, a space between a sealing substrate and an element substrate is filled with the seal material. If the electroluminescence element is a top emission type, it is desirable to use a transparent seal material. In addition, the seal material is dripped in a pixel area before sticking the substrates. It is preferable to spray the seal material over the pixel area with the ink jet method under decompression.

It is also possible that, after spraying the seal material over the pixel area with the ink jet method under decompression and hardening the seal material, an inorganic insulating film represented by a silicon nitride film is formed by the sputtering method, and the formation of a silicon nitride film after spraying the seal material with the ink jet method under decompression and hardening the seal material is repeated. Intrusion of moisture and impurities from the outside air can be blocked by providing the lamination of the seal material and the inorganic insulating film, and reliability is improved.

In addition, another constitution of the invention is an electroluminescence device including plural electroluminescence elements that have a cathode, layers containing organic compounds in contact with the cathode, and an anode in contact with the layers containing organic compounds, characterized in that a first electroluminescence element, a second electroluminescence element, and a third electroluminescence element are arranged in the electroluminescence device, the first electroluminescence element has a lamination of at least a hole transport layer, a first electroluminescence layer, and an electron transport layer, the second electroluminescence element has a lamination of at least the hole transport layer, a second electroluminescence layer, and the electron transport layer, the third electroluminescence element has a lamination of at least the hole transport layer, a third electroluminescence layer, and the electron transport layer, and two layers among the first electroluminescence layer, the second electroluminescence layer, and the third electroluminescence layer overlap partially.

In the above constitution, among the layers containing organic compounds sandwiched by the anode and the cathode, the two layers, the hole transport layer and the electron transport layer, are shared by the electroluminescence layers. Therefore, since evaporation accuracy of these two layers does not matter so much, an evaporation device with high accuracy has to be used only for the electroluminescence layers. In addition, it is desirable to select a material and a thickness appropriately when the two layers are shared and the electroluminescence device is made full-color.

In addition, in the above constitution, the electroluminescence device is characterized in that the electroluminescence elements have a hole injection layer consisting of a polymeric material. In the case in which the hole injection layer consisting of a polymeric material is formed by an application method using spin coat or the like, planarity is improved, and coverage and uniformity of thickness of a film formed on the hole injection layer can be made satisfactory. In particular, since thickness of the electroluminescence layer is made uniform, uniform light emission can be obtained.

Further, in the above constitution, the electroluminescence device is characterized in that the first electroluminescence element emits light of one of red, green, and blue.

Moreover, in the case in which a large area substrate that can be formed multiply is used, several evaporation masks stuck together are used. Therefore, depending on accuracy of sticking the evaporation masks, it is likely that deviation occurs for each panel in a TFT substrate and an evaporation pattern. Thus, in the invention, an evaporation pattern is measured in advance, setting of a stepper in TFT manufacturing is corrected appropriately on the basis of a value of the measurement to align an exposure pattern. A pattern with less deviation can be obtained if evaporation is performed using an evaporation mask after the TFT manufacturing with the stepper subjected to correction.

EMBODIMENT MODES OF THE INVENTION

Embodiment modes of the invention will be hereinafter explained.

First Embodiment Mode

Figure 1:
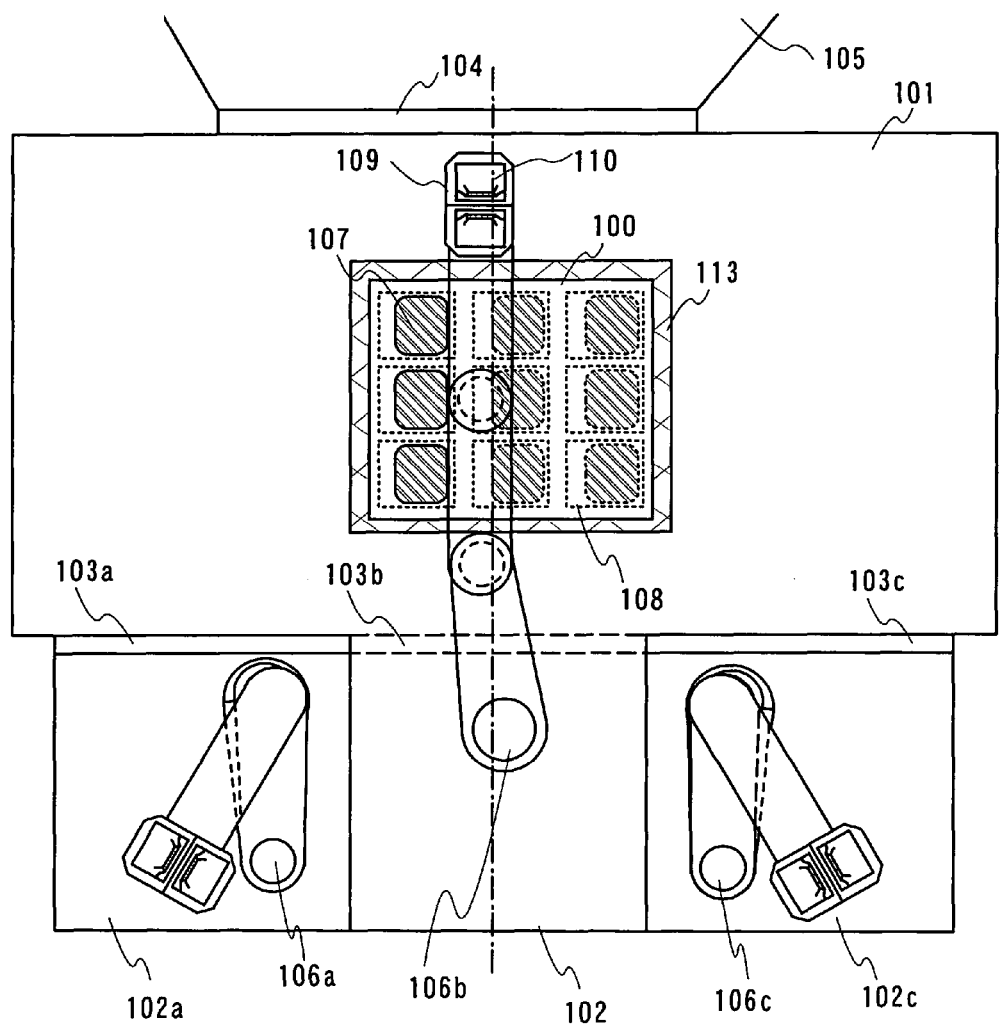
FIG. 1 is a top view showing an evaporation device of the invention. (First Embodiment Mode)

FIG. 1 shows an example of a top view of an evaporation device of the invention.

In FIG. 1, reference numeral 100 denotes a substrate; 101, a film formation chamber; 102a to 102c, installation chambers; 103a to 103c and 104, shutters; 105, a conveyance chamber; 106a to 106c, robot arms; 107, evaporated areas; 108, areas to be panels; 109, an evaporation holder, and 110, a container.

Note that an example in which nine areas to be panels 108 are designed on the substrate 100 is shown.

Although an example in which the shutters 103a to 103c and the installation chambers 106a to 106c are arranged in sideways is shown here, the arrangement is not specifically limited, and three robots may be arranged in one installation chamber.

In addition, a mask 113 is aligned in contact with the substrate 100, and RGB are separately coated by shifting one mask by a size of one pixel and performing alignment several times to perform evaporation.

Figure 2:
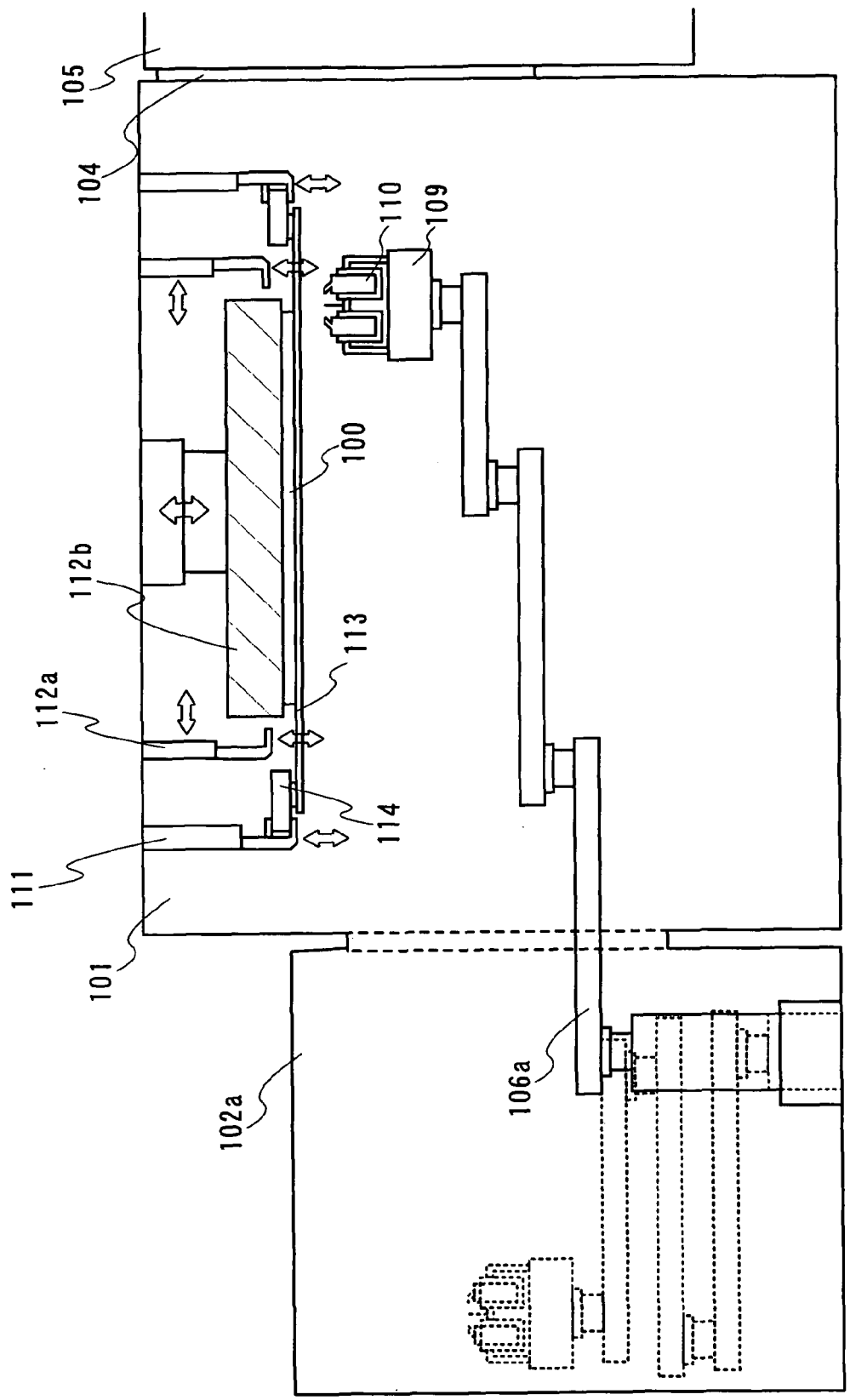
FIG. 2 is a sectional view showing the evaporation device of the invention. (First Embodiment Mode)

FIG. 2 shows a sectional view cut along an alternate long and short dash line in FIG. 1. Note that, in FIG. 2, portions identical with those in FIG. 1 are denoted by the identical reference numerals and signs.

The mask 113 of a thin plate shape having a pattern opening is fixed to a mask frame 114 of a frame shape by adhesion or welding. It is preferable to perform evaporation while performing heating suitable for a material to be evaporated, and a position where the mask frame 114 is fixed only has to be determined appropriately such that moderate tension is applied to the mask at temperature of the heating. In addition, alignment with a substrate is performed by a mask holder 111 supporting the mask 113 and the mask frame 114. First, a conveyed substrate is supported by an alignment mechanism 112a and mounted on the mask holder 111. Subsequently, the substrate mounted on the mask 113 is brought close to an alignment mechanism 112b to attract and fix the substrate together with the mask 113 by a magnetic force. Note that a permanent magnet (not shown) and heating means (not shown) are provided in the alignment mechanism 112b.

When evaporation is performed, a tip of the robot arm 106a, which is on standby in the installation chamber 102a, is moved to the film formation chamber 101, and evaporation is performed while moving the robot arm 106a in an X direction, a Y direction, or a Z direction. At the tip of the robot arm 106a, the evaporation holder 109 is provided, and the container 110 containing an evaporation material is set. As shown in FIG. 1, the three robot arms (moving means) 106a, 106b, and 106c mounted with difference evaporation sources move in one chamber freely to sequentially perform film formation in a selective manner.

Figure 3A:
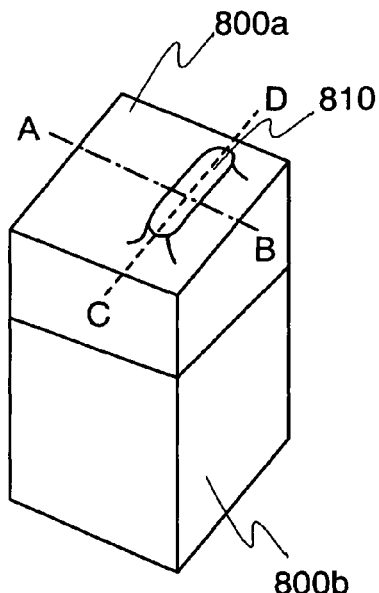
FIGS. 3A to 3E are diagrams showing examples of a container to be set in an evaporation source. (First Embodiment Mode)
Figure 3B:
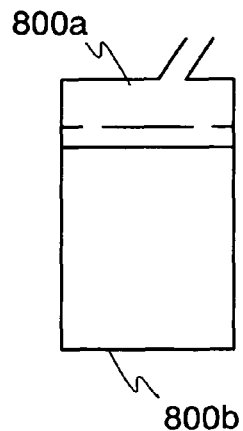
Figure 3C:
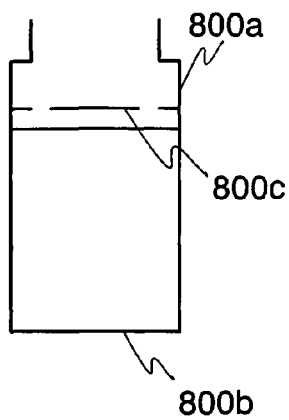

In the case in which co-evaporation for evaporating materials from different evaporation sources on an identical substrate is performed, an attachment angle of the evaporation sources may be set freely such that an evaporation center is aligned with one point on a substrate to be evaporated. However, a space between two evaporation sources is necessary to some extent in order to incline the substrate together with the evaporation sources. Therefore, as shown in FIGS. 3A to 3C, it is preferable to form the container 110 in a prism shape to adjust the evaporation center in a direction of the opening of the container. It is sufficient that the container is constituted by an upper part 800a and a lower part 800b, and plural upper parts with different angles, at which an evaporation material is flown out from an elliptical opening 810, are prepared and selected appropriately. Since a way of spreading or the like of evaporation is different depending on an evaporation material, it is sufficient to prepare two evaporation sources attached with different upper parts 800a when the co-evaporation is performed.

It is important to mix two kinds of different evaporation materials in the co-evaporation. With the containers shown in FIGS. 3A to 3C, the evaporation materials are mixed immediately after being discharged from an opening of the container, whereby a film can be formed on the substrate. In particular, in the evaporation device show in FIG. 2, a space distance d between the substrate and the evaporation holder is narrowed to representatively 30 cm or less, preferably 20 cm or less, and more preferably 5 cm to 15 cm to remarkably improve efficiency of use of the evaporation materials.

Note that FIG. 3A is a perspective view of the container, FIG. 3B is a sectional view cut along an alternate long and short dash line A-B, and FIG. 3C is a sectional view cut along a dotted line C-D.

In the case in which an attachment angle of an evaporation source is changed, a cylindrical container and a heater surrounding the container are inclined. Thus, in the case in which co-evaporation is performed using two containers, a space between the containers is increased. When the space is increased, it becomes difficult to mix different two evaporation materials uniformly. In addition, in the case in which it is desired to perform evaporation by narrowing a space between the evaporation source and a substrate, it becomes difficult to obtain uniform films.

Thus, in the invention, rather than changing the attachment angle of the evaporation source, an evaporation center is adjusted by the opening 810 of the container upper part 800a. The container is constituted by the container upper part 800a, the container lower part 800b, and a middle lid 800c. Note that plural small holes are provided in the middle lid 800c, and an evaporation material is passed through the holes at the time of evaporation. In addition, the container is formed of a material such as a sintered compact of BN, a compound sintered compact of BN and AlN, quartz, or graphite so as to withstand high temperature, high pressure, and decompression. Since a direction and a way of spreading of evaporation is different depending on an evaporation material, containers with an area of the opening 810 and positions of a guide portion of the opening and the opening adjusted suitable for each evaporation material are prepared appropriately.

Figure 3D:
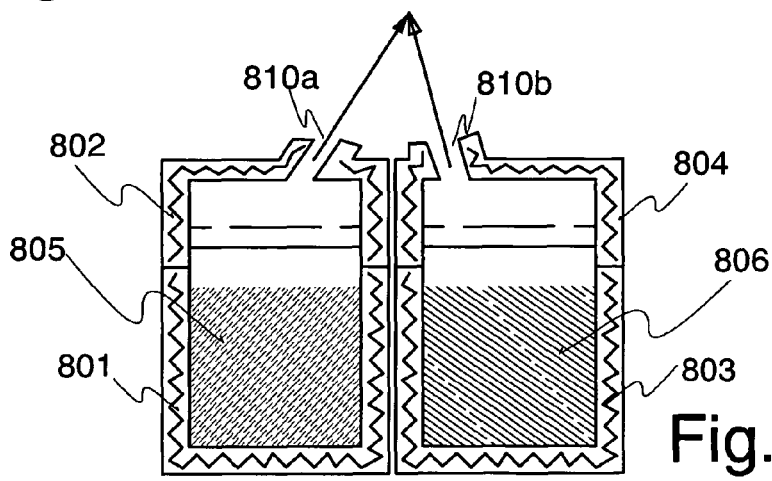

By adopting the container of the invention, the evaporation center can be adjusted without inclining the heater of the evaporation source. In addition, as shown in FIG. 3D, in co-evaporation, both an opening 810a and an opening 810b are placed to be opposed to each other to narrow a space between plural containers containing plural different evaporation materials (a material A 805 and a material B 806), whereby evaporation can be performed while mixing the evaporation materials uniformly. In FIG. 3D, heating means 801 to 804 are connected to separate power supplies and perform temperature adjustment independently from each other. In addition, in the case in which it is desired to perform evaporation by narrowing the space between the evaporation source and the substrate to, for example, 20 cm or less, uniform films can also be obtained.

Figure 3E:
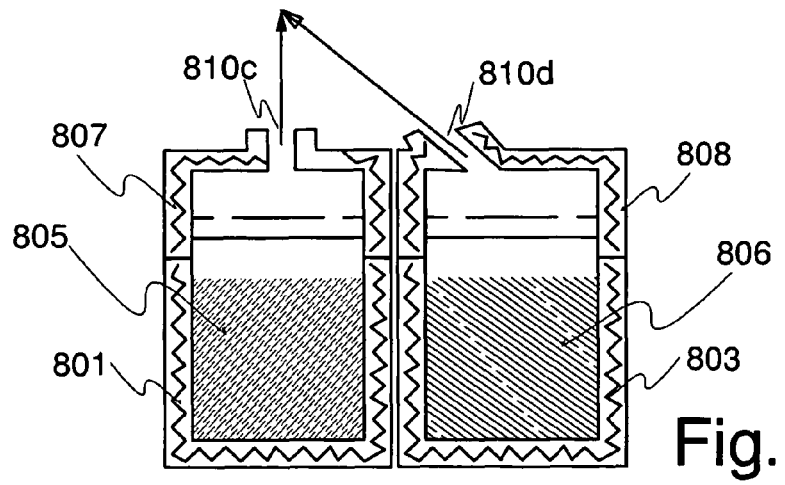

An example different from FIG. 3D is shown in FIG. 3E. FIG. 3E shows an example in which evaporation is performed using the upper part 800a with the opening 810c, from which an evaporation material is vaporized in a vertical direction, and the upper part 800a having the opening 810d inclined to meet the direction. In FIG. 3E, heating means 801, 803, 807, and 808 are also connected to separate power supplies and perform temperature adjustment independently from each other.

In addition, since the containers of the invention shown in FIGS. 3A to 3E has oblong elliptical openings, a uniform evaporation area is widened. Thus, the containers are suitable for performing evaporation uniformly while fixing a large area substrate.

Figure 4:
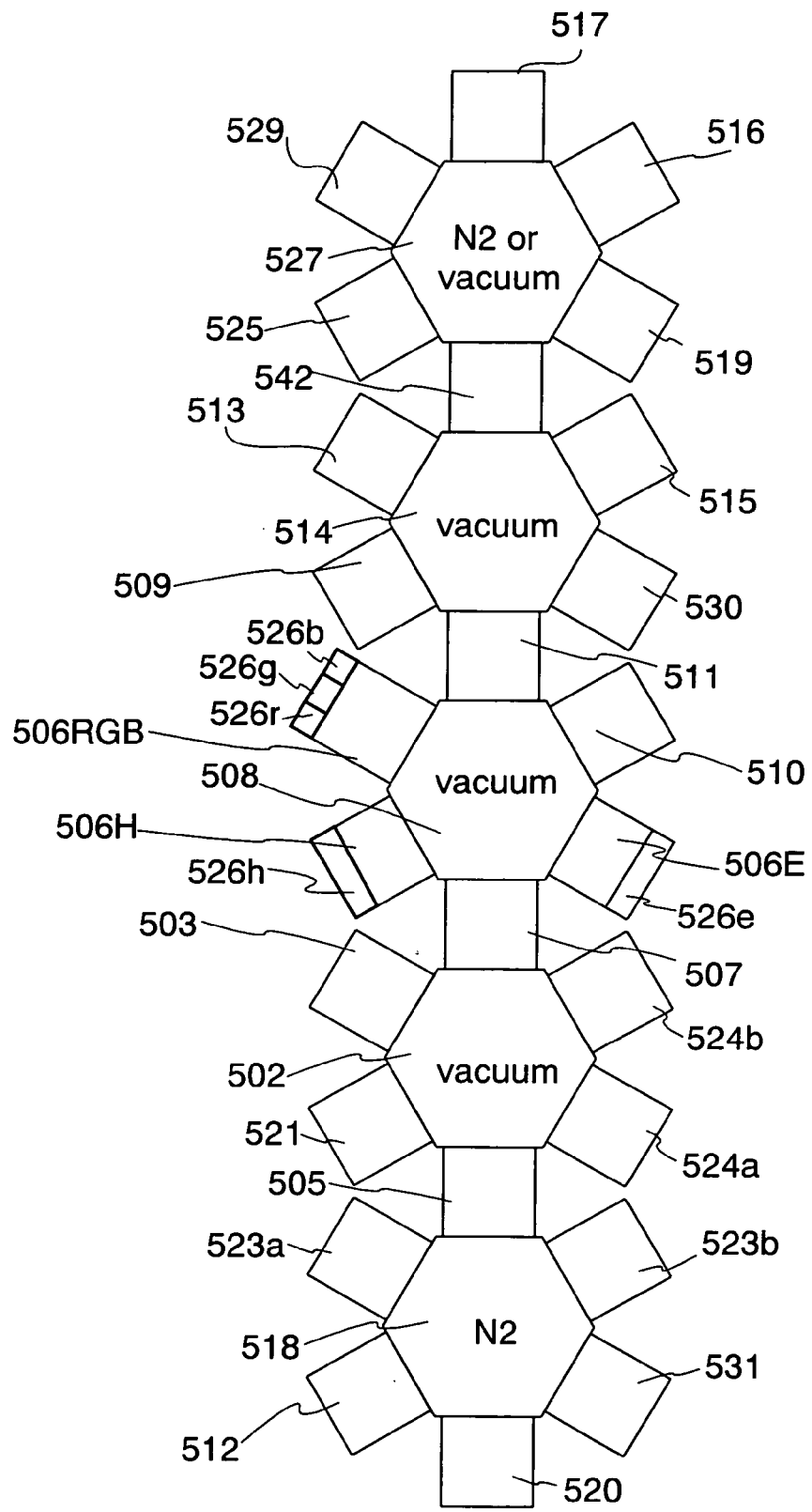
FIG. 4 is a top view showing an apparatus for forming a film of the invention. (First Embodiment)

FIG. 4 shows an apparatus for forming films of a multi-chamber type including the evaporation device shown in FIG. 1 as one chamber. Note that a structure of FIG. 4 will be described in a First Embodiment. In addition, it is needless to mention that it is possible to include the evaporation device as one chamber of an apparatus for forming a film of an inline type.

Second Embodiment Mode

Here, an example for performing seal dripping, seal drawing, or formation of auxiliary wiring with a droplet jet method, representatively, an ink jet method, using a device shown in FIG. 5 FIGS. 5A to 5D will be described.

Figure 5A:
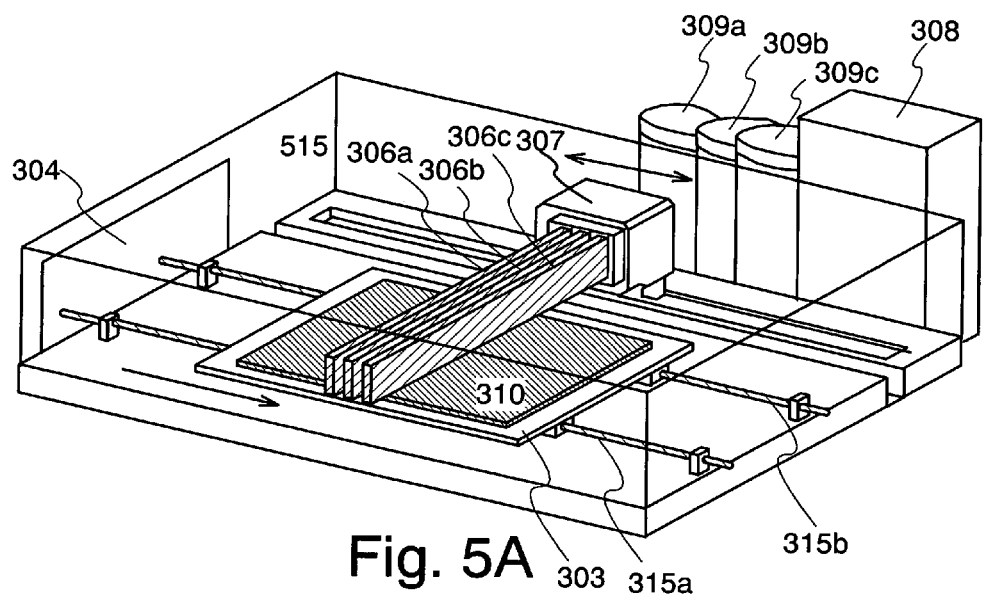
FIGS. 5A to 5D are diagrams showing a drip spray device. (Second Embodiment Mode)

FIG. 5A is a schematic perspective view showing an example of a structure of a linear droplet jet device. The linear droplet jet device shown in FIG. 5A has heads 306a to 306c and jets droplets from the heads 306a to 306c to thereby obtain a desired droplet pattern on a substrate 310. The linear droplet jet device can be applied to, other than a glass substrate with a desired size, a resin substrate represented by a plastic substrate, or a treated object such as a semiconductor wafer represented by silicon as the substrate 310.

In FIG. 5A, the substrate 310 is carried into a treatment chamber 515 from a carrying entrance 304, the substrate subjected to droplet jetting treatment is returned and carried out from the carrying entrance 304. The substrate 310 is mounted on a conveyance stand 303, and the conveyance stand 303 moves on rails 313a and 315b extending from the carrying entrance.

A head support section 307 supports the heads 306a to 306c for jetting droplets and moves in parallel with the conveyance stand 303. When the substrate 310 is carried into the treatment chamber 515, the head support section 307 simultaneously moves to meet a predetermined position where first droplet jetting treatment is performed. The movement of the heads 306a to 306c to the initial position is performed at the time when the substrate is carried in or at the time when the substrate is carried out, whereby jetting treatment can be performed efficiently.

Here, the heads 306a to 306c for jetting three different kinds of materials are prepared. For example, a seal material containing a gap material, a seal material containing transparent resin for filling a space between substrates, and an ink containing electrically conductive particulates for forming wiring and electrodes can be jetted from the head 306a, 306b, and 306c, respectively.

The droplet jetting treatment is started when the substrate 310 reaches a predetermined position according to the movement of the conveyance stand 303. The droplet jetting treatment is attained by a combination of relative movement of the head support section 307 and the substrate 310 and droplet jet from the heads 306a to 306c supported by the heat support section. By adjusting moving speeds of the substrate 310 and the head support section 307 and a period of jetting droplets from the heads 306a to 306c, a desired droplet pattern can be drawn on the substrate 310. In particular, since high accuracy is required for the droplet jetting treatment, it is desirable to stop the movement of the conveyance stand 303 at the time of droplet jet and sequentially use only the head support section 307 with high controllability for scanning. It is desirable to select a drive system with high controllability such as a servomotor or a pulse motor for driving of the heads 306a to 306c. In addition, the scanning by the head support section 307 for the heads 306a to 306c is not limited to one direction, and the droplet jetting treatment may be performed by reciprocation or repetition of reciprocation. Droplets can be jetted over the entire substrate by the movement of the substrate 310 and the head support section 307.

Droplets are supplied to liquid chambers inside the heads 306a to 306c from droplet supply sections 309a to 309c installed outside the treatment chamber 515 via the head support section 307. This supply of droplets is controlled by control means 308 installed outside the treatment chamber 515 but may be controlled by control means incorporated in the head support section 307 inside the treatment chamber 515.

Main functions of the control means 308 are, other than the control for the supply of droplets, control for the movement of the conveyance stand 303 and the head support section 307 and droplet jet corresponding to the movement. In addition, it is possible to download data of pattern drawing by the droplet jet from the outside of the device through software such as a CAD. These data are input by a method such as graphic input or coordinate input. An automatic residue warning function may be added by providing a mechanism, which detects a residue of a composition used as droplets, inside the heads 306a to 306c to transfer information indicating the residue to the control means 308.

Although not shown in FIG. 5A, a sensor for positioning the substrate or a pattern on the substrate, means for introducing gas to the treatment chamber 515, exhaust means inside the treatment chamber 515, means for subjecting the substrate 310 to heating treatment, means for irradiating light on the substrate 310, means for measuring various physical property values such as temperature and pressure, and the like may be further installed as required. In addition, it is also possible to collectively control these means with the control means 308 installed outside the treatment chamber 515. Moreover, if the control means 308 is connected to a production control system or the like by a LAN cable, a wireless LAN, or an optical fiber, it becomes possible to uniformly control processes from the outside, which leads to improvement in productivity.

Figure 5B:
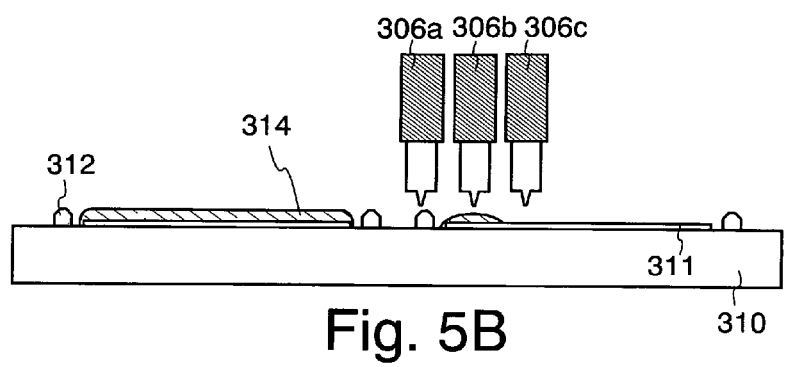
Figures 5C, 5D:
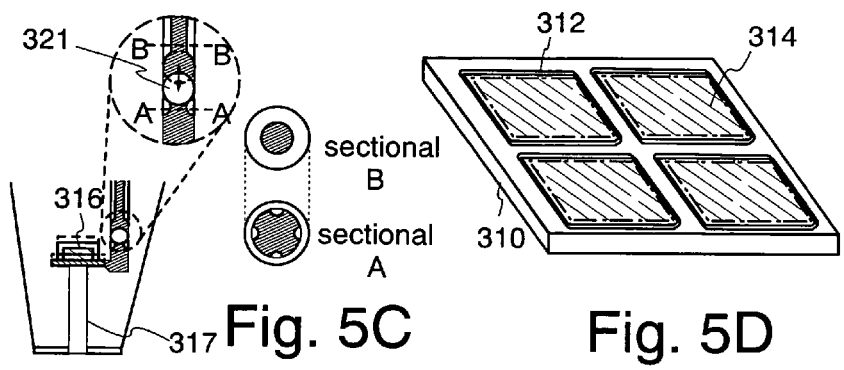

FIG. 5B shows a state in which a first seal material 312 and a second seal material 314 are dripped on the substrate 310 using two of the three heads 306a to 306c. The first seal material 312 is used for drawing by the head 306a, and the second seal material 314 is dripped by the head 306b so as to cover a pixel portion 311. The materials may be jetted from the two heads simultaneously, or may be jetted from one head and hardened and then jetted from the other head. Note that FIG. 5D shows a perspective view of the substrate 310 for which the jetting treatment of the first seal material 312 and the second seal material 314 has been completed. A material to be jetted from the nozzle 306a is not specifically limited as long as the material is an organic material. It is sufficient to use ultraviolet curing or thermoset epoxy resin representatively. A material to be jetted from the nozzle 306b is not specifically limited as long as the material is an organic material having translucency. It is sufficient to use ultraviolet curing or thermoset epoxy resin representatively.

In addition, an ultraviolet ray irradiating function or a heating lamp may be provided in the device shown in FIG. 5A to harden a seal material in the device.

A container (canister can) for stocking a material solution in a solution application device is prepared for the droplet supply sections 309a to 309c. It is desirable to form the container with a material having air tightness, in particular, sufficient resistance against penetration of oxygen and moisture, and it is sufficient to use stainless steel, aluminum, or the like. In addition, an introduction port for introducing nitrogen, a rare gas, or other inert gases is provided in the container, and an inert gas is introduced from the introduction port to pressurize internal pressure of the container. If a large pressure difference occurs between the internal pressure of the container and an internal pressure of a film formation chamber, the internal pressure of the container may be decompressed. For example, it is sufficient to set the internal pressure of the container to a degree of vacuum lower than a degree of vacuum inside the film formation chamber.

In addition, in the case in which the internal pressure of the container is decompressed, since it is likely that the gas flows back when the treatment chamber 515 is pressurized to the atmospheric pressure, a back flow preventing mechanism using a ball is provided. A structure inside the heads 306a to 306c is explained in FIG. 5C. In FIG. 5C, an area surrounded by a dotted line is an enlargement of a head portion in a device for applying solution (hereinafter referred to as solution applying device), and a part of the figure shows an internal structure. Protrusions for regulating a floating amount of a ball 321 are provided on a section A such that an ink flows beside the ball 321. The ball 321 has a diameter slightly smaller than a diameter of a supply pipe so as to be floatable in a certain range. In addition, this ball 321 also plays a role of easing a steep flow of the ink. The supply pipe is narrowed in the middle and has a smaller diameter than the diameter of the ball 321 on a section B such that, when a fluid flows back, the ball 321 completely blocks the supply pipe. The heads have jetting sections 317 having a function of jetting a solution, and piezoelectric elements 316 are provided in the respective jetting sections 317. The piezoelectric elements 316 are provided so as to block the supply pipes. Gaps are formed between the piezoelectric element 316s and inner walls of the pipes due to vibration, and a liquid (a seal material or an ink containing electrically conductive particulates represented by a nano-metal ink) is passed through the gaps. The liquid can be jetted forcefully even if the gaps are small because the inside of the film formation chamber is decompressed. In addition, a liquid is filled in the respective jetting sections. Note that FIG. 5C shows a state in which a shutter is closed due to vibration of the piezoelectric element 316.

Here, an example in which the droplet jet is performed by a so-called piezo method using the piezoelectric element 316 is described. However, depending on a material of a droplet, a so-called thermal method (thermal ink jet method) for heating a heating element to cause bubbles and push out the droplet may be used. In this case, the piezoelectric element 316 is replaced with the heating element.

Note that only one jetting section is shown in FIG. 5C. However, it is possible to arrange plural jetting sections (nozzles) in parallel. It can be said that, considering throughput, it is most desirable to arrange the jetting sections by the number of pixels for one row or one column in a pixel portion or the number equivalent to one side of an area surrounding the pixel portion.

Evacuating and exhausting means (not shown) may be connected to the treatment chamber 515 to maintain a space between the heads 306a to 306c and the substrate 310 at decompression, that is, a pressure lower than the atmospheric pressure. More specifically, the pressure is $1 \times 10^2$ to $2 \times 10^4$ Pa (preferably, $5 \times 10^2$ to $5 \times 10^3$ Pa) for an inert atmosphere. The liquid (a seal material or an ink containing electrically conductive particulates) filled in the jetting section 317 is pulled out from the nozzle by opening and closing the supply pipe with the piezoelectric element 316 to decompress the treatment chamber 515 and jetted toward the substrate 310. Then, the jetted droplet advances while volatilizing solvent under decompression, and the remaining material (a seal material or electrically conductive particulates) deposits on the substrate. Then, droplets are sequentially discharged from the jetting section (nozzle) 317 at predetermined timing. As a result, the material is deposited intermittently.

The droplet can be jetted on the substrate 310 to be treated by the above-mentioned means. The droplet jetting method includes a so-called sequential method (dispenser method) for jetting droplets continuously to form a linear pattern and an on-demand method for jetting droplets in a dot shape. In the device structure in FIGS. 5A to 5D, the on-demand method is shown. However, it is also possible to use head according to the sequential method.

Figure 6:
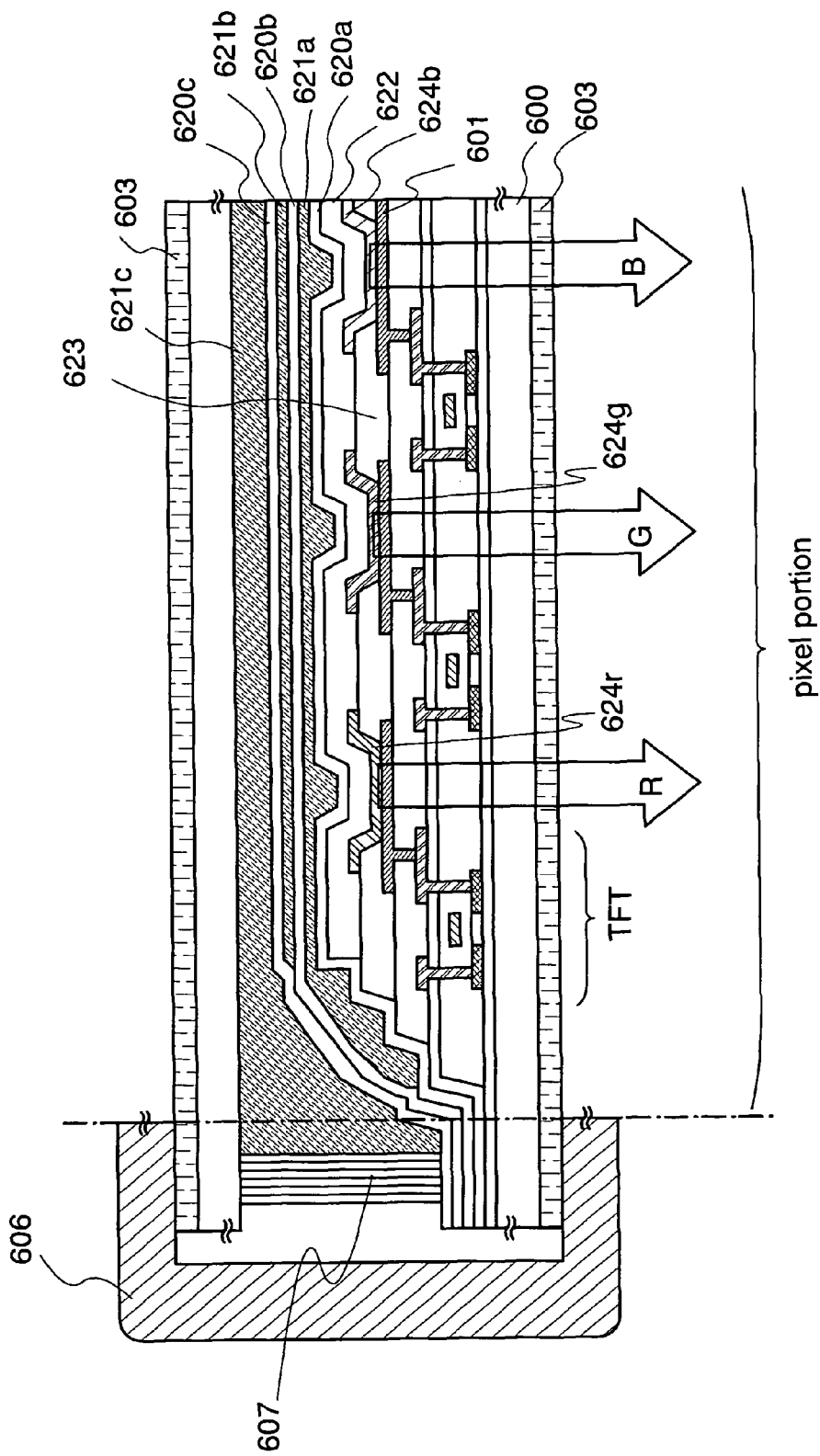
FIG. 6 is a sectional view showing an electroluminescence device of the invention. (Second Embodiment Mode)

In addition, as another application, as shown in FIG. 6, in order to seal electroluminescence elements covered by an inorganic insulating layer 620a more firmly, it is also possible that a seal layer 621a is formed using only the nozzle 306b and hardened, then, an inorganic insulating layer 620b is formed by the sputtering method on the seal layer 621a, a seal layer 621b is formed on the inorganic insulating layer 620b using only the nozzle 306b again and hardened, and then an inorganic insulating layer 620c and a seal layer 621c are formed in the same manner. In particular, intrusion of moisture and impurities from a side of a panel is blocked by a lamination of the seal layers 621a to 621c and the inorganic insulating layers 620a to 620c.

Note that, in FIG. 6, reference numeral 600 denotes a substrate; 601, a transparent electrode; 603, a polarization plate; 606, a cover; 607, a seal material (including a gap material); 620a to 620c, inorganic insulating layers (silicon nitride film (SiN), silicon oxide nitride film (SiNO), aluminum nitride film (AlN), or aluminum nitride oxide film (AlNO), etc.); 621a to 621c, seal layers; 622, a transparent electrode; and 623, a partition wall (also called bank). In addition, reference sign 624b denotes a layer containing organic compounds, which forms blue light emission as an electroluminescence element, 624g denotes a layer containing organic compound, which forms green light emission as an electroluminescence element, and 624r denotes a layer containing organic compounds, which forms red light emission as an electroluminescence element, whereby full-color display is realized. Note that the transparent electrode 601 is an anode (or cathode) of an electroluminescence element connected to a source electrode or a drain electrode of a TFT.

Figure 7A:
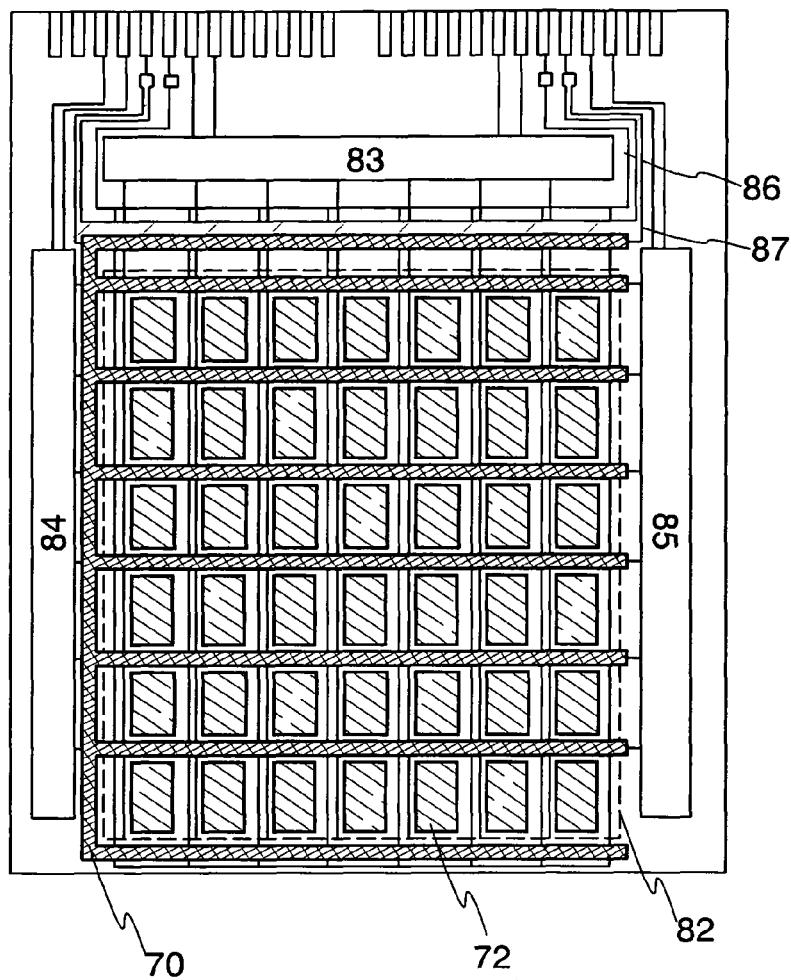
FIGS. 7A and 7B are a top view and a second view of a panel provided with an auxiliary wiring. (Second Embodiment Mode)
Figure 7B:
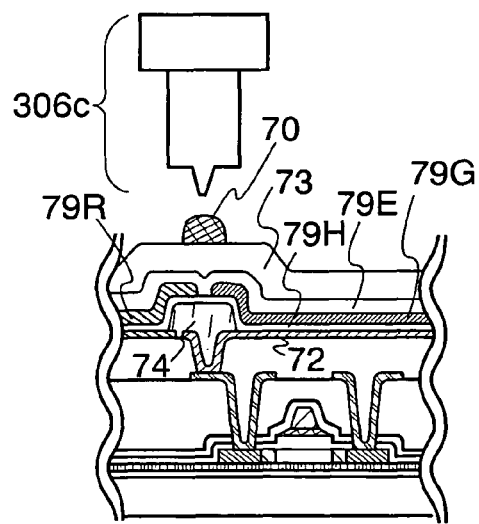

In addition, as another application, an auxiliary wiring 70 may be drawn by the ink jet method using the nozzle 306c as shown in FIG. 7B. FIG. 7B shows a sectional view of one pixel in a pixel portion 82 shown in FIG. 7A. A layer containing organic compounds consisting of a hole transport layer 79H, an electroluminescence layer 79G, and an electron transport layer 79E is formed on a second electrode (anode) 72, and a transparent electrode 73 to be a first electrode (cathode) is provided on the layer. The transparent electrode 73 to be the first electrode (cathode) is a lamination of a thin film containing metal with a small work function (alloy such as MgAg, MgIn, AlLi, $CaF_2$, or CaN, or film formed of an element belonging to first group or second group in a periodic table and aluminum by a co-evaporation method) and a transparent conductive film (ITO (indium oxide tin oxide alloy), indium oxide zinc oxide alloy ($In_2O_3$-AnO), zinc oxide (ZnO), etc.).

The auxiliary wiring 70 is formed on the transparent electrode 73, which is a cathode for the electroluminescence element, to realize reduction in resistance as electrodes as a whole. In addition, the auxiliary wiring 70 also functions as a light shielding film, which leads to improvement of contrast. A lead wiring, a connection wiring, and the like may be formed by the ink jet method in the same manner.

As a material to be jetted from the nozzle 306c, for example, an organic solution of a paste-like metal material, a conductive polymer in which the paste-like metal is dispersed, or the like, an organic solution of a metal material in an ultra-fine particle state, a conductive polymer in which the metal material is dispersed, or the like can be used. The metal material in an ultra-fine particle state is a metal material processed into particulates of several μm to sub μm or particulates in an nm level. One or both of the particulates are dispersed in an organic solution and used.

In addition, in FIG. 7A, reference numeral 82 denotes a pixel portion; 83, a source side drive circuit; 84 and 85, gate side drive circuits; 86, a power supply line; and 72, a second electrode (anode). Wirings to be formed simultaneously with the first electrode are a power supply line 86, a lead wiring 87, and a source wiring. In FIG. 7A, a terminal electrode to be connected to an FPC is formed simultaneously with a gate wiring.

This Embodiment Mode can be combined with the First Embodiment Mode freely.

Third Embodiment Mode

Here, a method of controlling deviation of an evaporation pattern is provided.

Usually, a TFT, a pixel electrode (an electrode to be an anode or a cathode of an electroluminescence element), and a partition wall (also called a bank) are formed according to a marker on a substrate. Thereafter, evaporation is applied to the substrate in which the TFT, the pixel electrode, and the partition wall (bank) are formed. In particular, if positions of the pixel electrode and a layer containing organic compounds deviate, a defect, for example, short circuit is caused.

In a mask for multiple forming, several masks adhere with each other in the same pattern. If accuracy of adhesion is poor, deviation occurs for each panel.

Thus, in the invention, a stepper exposure position is corrected on the basis of an evaporation pattern, which is obtained by applying evaporation to a dummy substrate using a mask, a TFT is manufactured on the basis of the stepper exposure position, and thereafter, evaporation is performed, whereby deviation is controlled. In other words, a TFT is manufactured according to a mask to be used.

Figure 8:
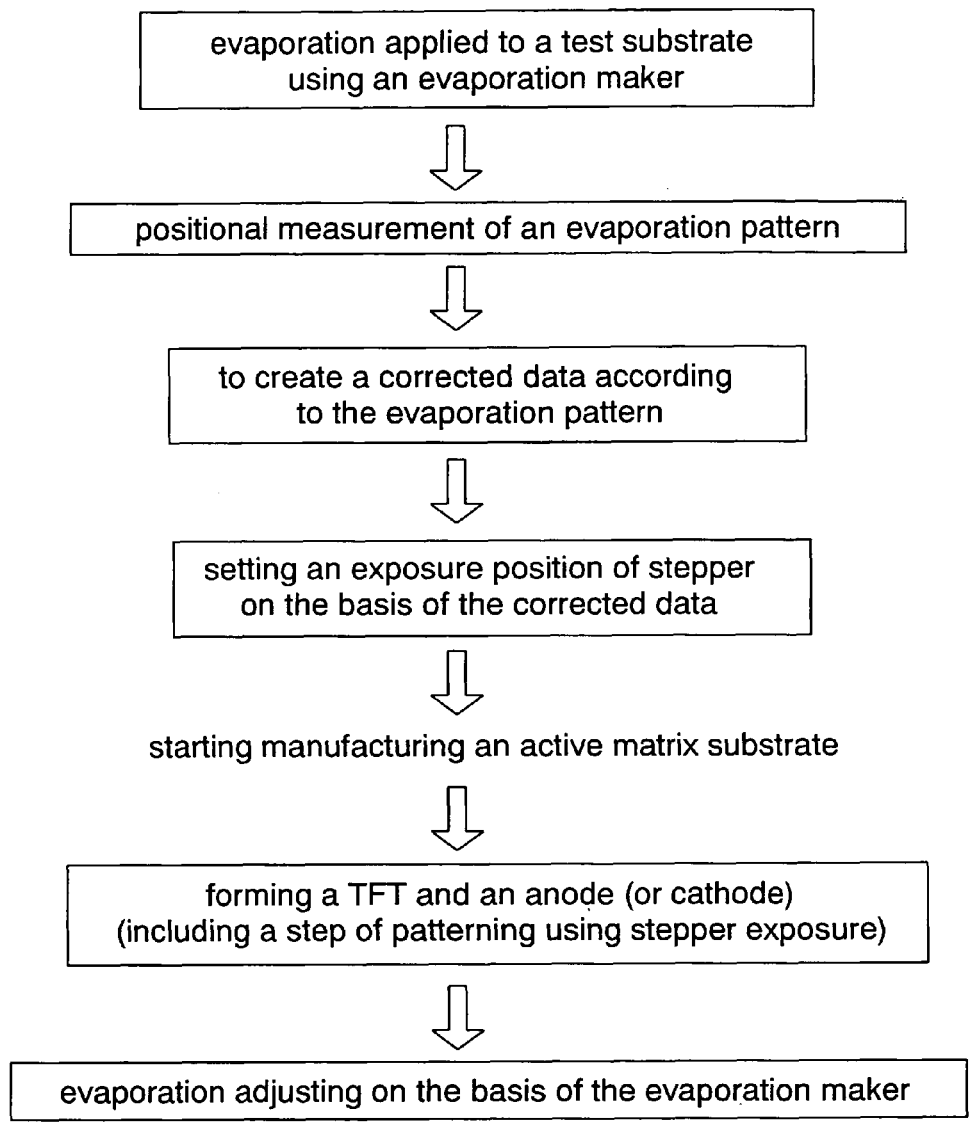
FIG. 8 is a diagram showing a process flow diagram. (Third Embodiment Mode)

FIG. 8 shows a flow diagram of the invention. First, evaporation is applied to a test substrate using a mask. Although the mask for multiple forming with plural masks stuck is manufactured to have high accuracy, the masks may deviate slightly, and it is likely that there is a subtle difference depending on each mask. It is also possible that an evaporation pattern depends on an evaporation device. Here, an evaporation pattern in an evaporation device used in manufacturing of an electroluminescence device is obtained.

Subsequently, a large number of obtained evaporation patterns are measured. Amounts of deviation at four corners and in the center are measured in both the X direction and the Y direction with respect to one shot of a stepper on the basis of obtained data to create corrected data.

Subsequently, an exposure position of the stepper is set on the basis of the corrected data. In this way, stepper exposure setting according to a specific evaporation mask can be performed.

Subsequently, an active matrix substrate is manufactured.

A TFT, an anode (or cathode), and a partition wall are formed on the basis of the evaporation pattern measured in advance. Therefore, when a film containing organic compounds is formed by evaporation, deviation can be reduced.

In the case in which the evaporation mask is changed, it is sufficient to measure an evaporation pattern every time the evaporation mask is changed, and stepper exposure and the like are adjusted on the basis of a value of the measurement.

Fourth Embodiment Mode

Here, the invention will be hereinafter explained with 3×3 pixels among a large number of pixels regularly arranged in a pixel portion as an example.

Figure 9A:
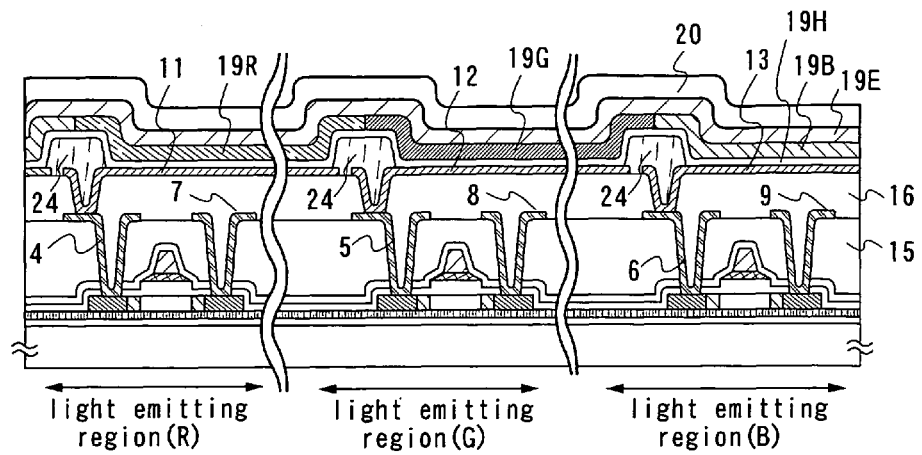
FIGS. 9A to 9D are sectional views showing an electroluminescence device of the invention. (Fourth Embodiment Mode)

FIG. 9A is an example of a sectional view. Among layers containing organic compounds sandwiched by an anode and a cathode, at least one layer, for example, a hole transport layer (or hole injection layer) 19H is shared. In FIG. 9A, an electron transport layer (or electron injection layer) 19E is also shared. In the example of FIG. 9A, electroluminescence layers 19R, 19G, and 19B are evaporated with high accuracy, respectively. Therefore, end faces of the electroluminescence layers 19R, 19G, and 19B are located on a partition wall (bank) 24.

In addition, if two layers among the layers containing organic compounds sandwiched by the anode and the cathode are shared, since accuracy of evaporation of the two layers does not matter so much, an evaporation device with high accuracy has to be used only for electroluminescence layers. Therefore, in the case in which a common layer other than the electroluminescence layers is formed, it is preferable to use the ink jet method or the spin coating method that can treat the layer in relatively short time. It is desirable to select a material and a thickness appropriately when the two layers are shared and the electroluminescence device is made full-color.

Reference numerals 11 to 13 denote cathodes (anodes) of an electroluminescence element, and 20 denotes an anode (or cathode) of the electroluminescence element. Both ends of the cathodes (or anodes) 11 to 13 of the electroluminescence element and a part between the ends are covered by the partition wall (bank) 24 formed of an inorganic insulating object. Here, a transparent conductive film is used as the anode (or cathode) 20 of the electroluminescence element to pass light from each electroluminescence element.

A sealing substrate (not shown here) is stuck by a seal material (not shown here) such that a space of about 10 μm is kept as a distance to the anode (cathode) 20 of the electroluminescence element, whereby all electroluminescence elements are closed.

In FIG. 9A, a TFT 1 is an element that controls a current flowing to an electroluminescence element emitting red light, and reference numerals 4 and 7 denote a source electrode or a drain electrode. In addition, a TFT 2 is an element that controls a current flowing to an electroluminescence element emitting green light, and reference numerals 5 and 8 denote a source electrode or a drain electrode. A TFT 3 is an element that controls a current flowing to an electroluminescence element emitting blue light, and reference numerals 6 and 9 denote a source electrode or a drain electrode. Reference numerals 15 and 16 denote an interlayer insulating film consisting of an organic insulating material or an inorganic insulating film material.

Figure 9B:
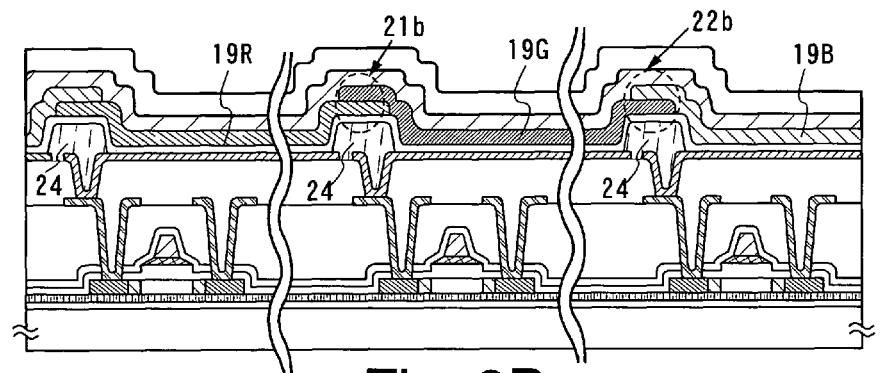

FIG. 9B is another example of a sectional view. As shown in FIG. 9B, the electroluminescence layer 19R emitting red light and the electroluminescence layer 19G emitting green light are laid one on top of another partially to form a laminated portion 21b. In addition, the electroluminescence layer 19G emitting green light and the electroluminescence layer 19B emitting blue light are laid one on top of another partially to form a laminated portion 22b. It is useful for widening an electroluminescence area and manufacturing a bright display to locate laminated portions 21b and 22b on the partition wall (bank) 24, in particular, to reduce a width of the partition wall (bank) 24 (e.g., 10 μm, preferably 5 μm or less) to stack electroluminescence layers.

Since the electroluminescence layers may be laid one on top of another in this way, when a full-color flat panel display using electroluminescence colors of red, green, and blue is manufactured, high definition and a high aperture ratio can be realized regardless of a film formation method (the ink jet method, the evaporation method, the spin coating method, etc.) for a layer containing organic compounds or accuracy of film formation.

In particular, in the case in which electroluminescence layers of red, green and blue (R, G, and B) are formed by the ink jet method with which the electroluminescence layers can be formed simultaneously, treatment time can be further reduced.

Figure 9C:
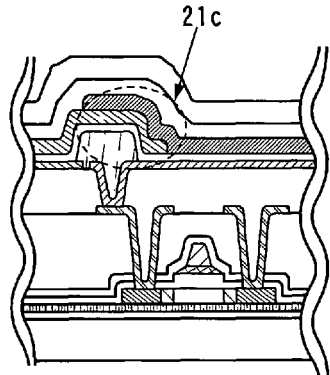

FIG. 9C is another example of a sectional view. In FIG. 9C, a laminated portion 21c is provided on the cathode (or anode) 12 of the electroluminescence element. Therefore, the laminated portion 21c also emits light slightly.

Figure 10:
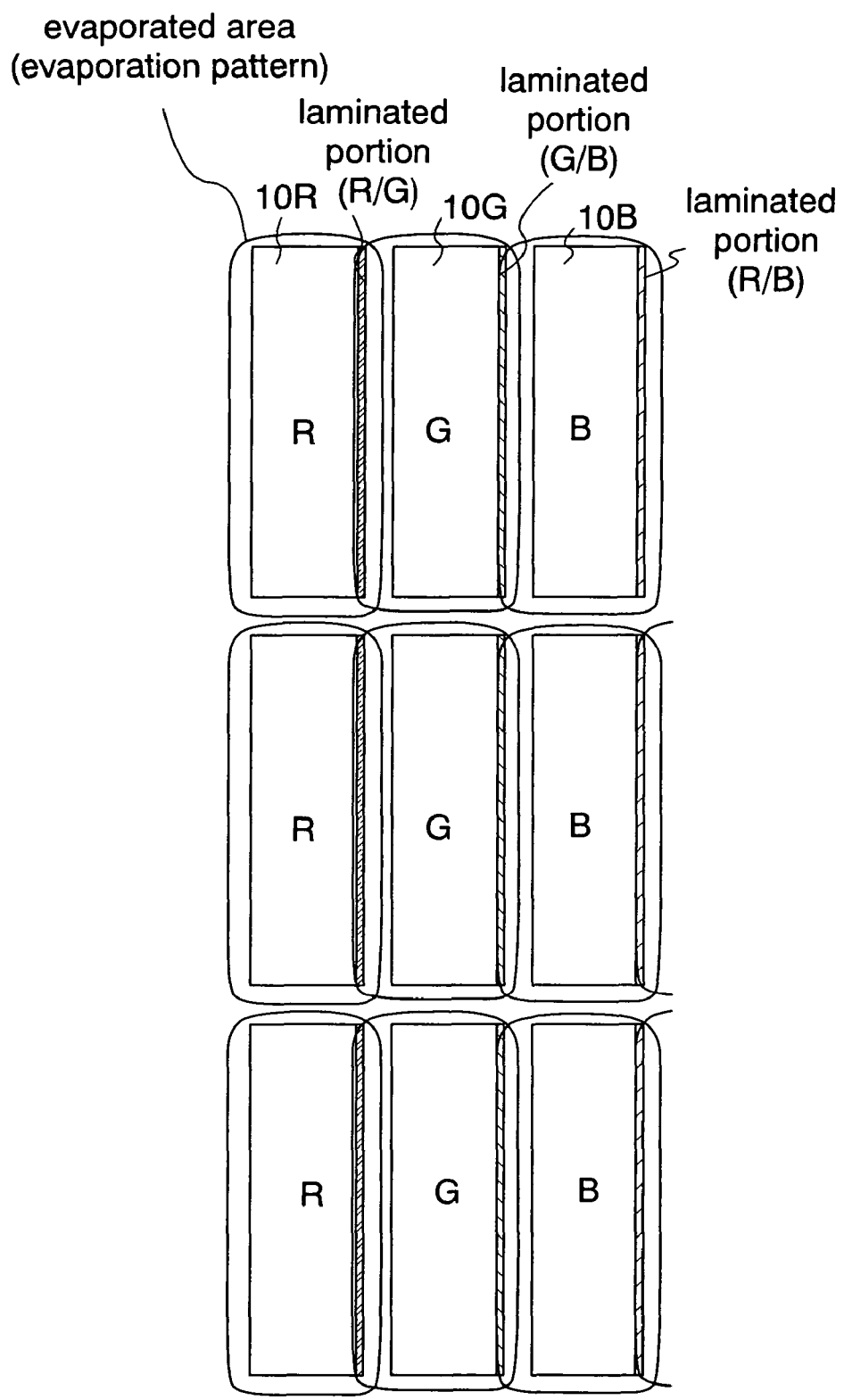
FIG. 10 is a top view showing the electroluminescence device of the invention. (Fourth Embodiment Mode)

FIG. 10 is a top view corresponding to FIG. 9C. In FIG. 10, an electroluminescence area 10R indicates an electroluminescence area for red, an electroluminescence area 10G indicates an electroluminescence area for green, and an electroluminescence area 10B indicates an electroluminescence area for blue. A full-color electroluminescence display device is realized by these electroluminescence areas for three colors. In the invention, an electroluminescence layer emitting red light and an electroluminescence layer emitting green light are laid one on top of another partially to form a laminated portion. In addition, an electroluminescence layer emitting green light and an electroluminescence layer emitting blue light are laid one on top of another partially to form a laminated portion.

Electroluminescence luminance in the laminated portion is about one thousandth of electroluminescence luminance in the electroluminescence areas 10R, 10G, and 10B. In addition, since the electroluminescence layers overlap at an identical width in the X direction (or Y direction) in the laminated portion, same luminance correction only has to be performed on one line. A person carrying out the invention only has to adjust luminance of an entire panel appropriately by changing a signal applied to an electroluminescence element according to a set width in the laminated portion.

Figure 9D:
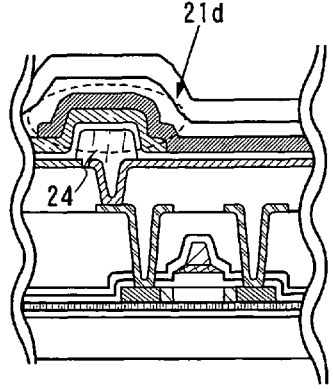

In addition, FIG. 9D is another example of a sectional view. A laminated portion 21d covers the partition wall (bank) 24 completely, and slight emitted light due to the laminated portion is present on both sides of the partition wall (bank) 24.

In addition, in FIGS. 9A to 9D, a structure for emitting light in a direction toward the transparent electrode 20 from the layer containing organic compounds, a structure for emitting light in a direction toward the TFT from the layer containing organic compounds, or a structure for emitting light in both the directions can be adopted.

Figure 11A:
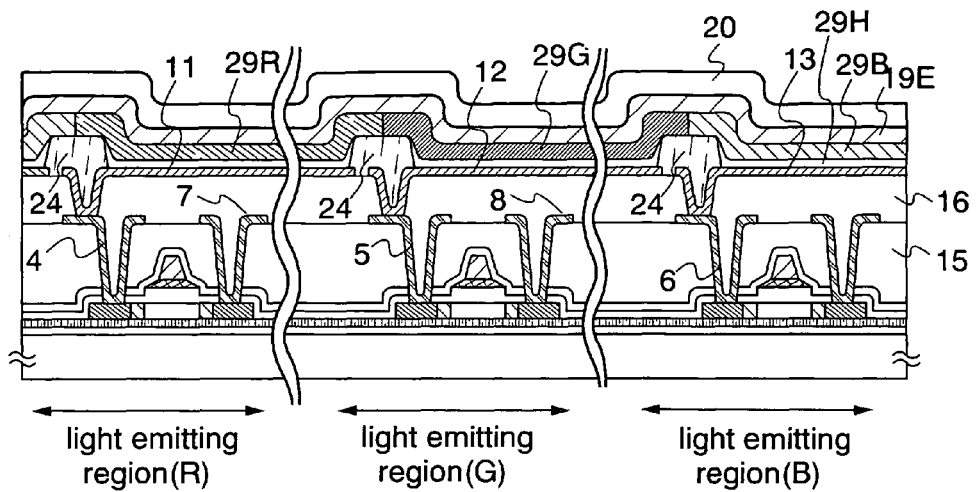
FIGS. 11A to 11D are sectional views showing the electroluminescence device of the invention. (Fourth Embodiment Mode)

FIG. 11A is an example in which a hole injection layer 29H is formed by the application method. Note that, since FIG. 11A is different from FIG. 9A only in a lamination structure of a layer containing organic compounds, the identical portions are denoted by the same reference numerals and signs.

The hole injection layer 29H only has to be formed by the ink jet method or the spin coat method using poly (ethylene dioxythiophene)/poly (styrene sulfonic acid) water solution (PEDOT/PSS), polyaniline/camphorsulfonic acid water solution (PANI/CSA), PTPDES, Et-PTPDEK, PPBA, or the like.

In addition, FIG. 11A shows an example in which the electroluminescence layers 29R, 29G, and 29B are evaporated with high accuracy, respectively. Therefore, end faces of the electroluminescence layers 29R, 29G, and 29B are located on the partition wall (bank) 24. In the case in which the hole injection layer 29H is formed by the spin coat method, the hole injection layer 29H is rarely formed on the partition wall (bank) 24. Therefore, a side of the partition wall (bank) 24 is covered by the hole injection layer 29H, but the electroluminescence layers 29B, 29G, and 29R are in contact with each other over the partition wall (bank) 24. Note that, although not shown in the figure here, a hole transport layer common to all pixels is provided between the electroluminescence layers 29B, 29G, and 29R and the hole injection layer 29H.

In the case in which the hole injection layer consisting of a polymeric material is formed by the application method using spin coat or the like, planarity is improved, and coverage and uniformity of thickness of a film formed on the hole injection layer can be made satisfactory. In particular, since thickness of the electroluminescence layer is made uniform, uniform light emission can be obtained. In this case, it is preferable to perform heating under vacuum (100 to 200° C.) immediately before film formation of the electroluminescence layers 29B, 29G, and 29R by the evaporation method after forming a hole injection layer with the application method. For example, after cleaning a surface of a first electrode (anode) with a sponge, after applying poly (ethylene dioxythiophene)/poly (styrene sulfonic acid) water solution (PEDOT/PSS) over the entire surface with a thickness of 60 nm by the spin coat method, and after subjecting the substrate to preliminary baking for ten minutes at 80° C. and main baking for one hour at 200° C. and to heating under vacuum (170° C., heating for thirty minutes, cooling for thirty minutes) immediately before evaporation, the electroluminescence layers 29B, 29G, and 29R only have to be formed by the evaporation method without being exposed to the atmosphere. In particular, in the case in which an ITO film is used as an anode material and unevenness and fine particles are present on a surface thereof, influence of these unevenness and fine particles can be reduced by setting the thickness of PEDOT/PSS to 30 nm or more.

Figure 11B:
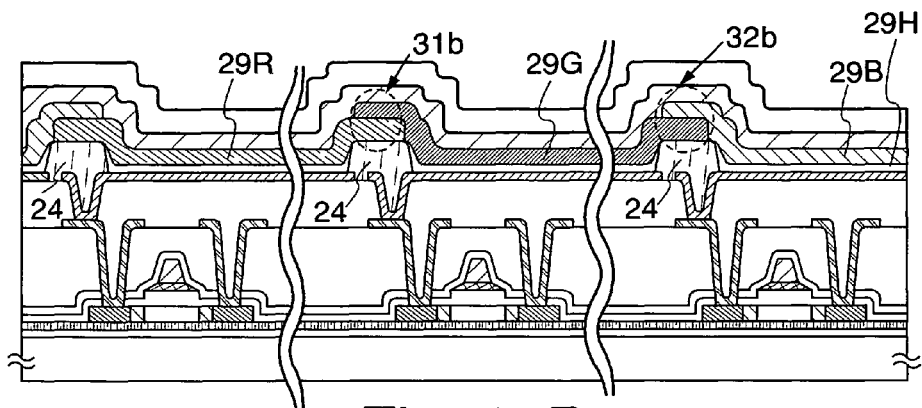

FIG. 11B is another example of a sectional view. As shown in FIG. 11B, the electroluminescence layer 29R emitting red light and the electroluminescence layer 29G emitting green light are laid one on top of another partially to form a laminated portion 31b. In addition, an electroluminescence layer 29G emitting green light and the electroluminescence layer 29B emitting blue light are laid one on top of another partially to form a laminated portion 32b. In this figure, again, since the hole injection layer 29H is formed by the spin coat method, the hole injection layer 29H is rarely formed on the partition wall (bank) 24.

Figure 11C:
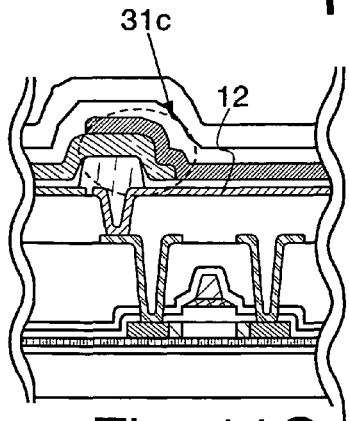

FIG. 11C is another example of a sectional view. In FIG. 11C, a laminated portion 31c is provided on a cathode (or anode) 12 of an electroluminescence element. Therefore, the laminated portion 31c also emits light slightly.

Figure 11D:
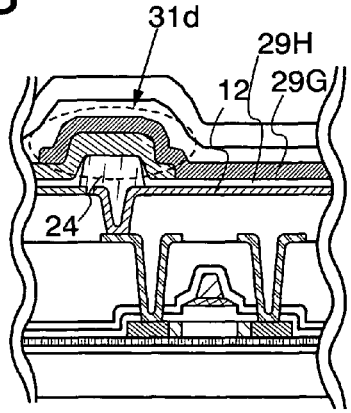

FIG. 11D is another example of a sectional view. A laminated portion 31d covers the partition wall 24 completely, slight emitted light due to the laminated portion 31d is present on both sides of the partition wall (bank) 24.

Note that, in the case in which the structures shown in FIGS. 9A to 9D and FIGS. 11A to 11D are adopted, the hole injection layer 29H can be formed by the spin coat method, and the hole transport layer 19H, the electroluminescence layers 19R, 19G, 19B, 29R, 29G, and 29B, and the electron transport layer 19E can be formed by the ink jet method. In addition, even if all the hole injection layer, the hole transport layer, the electroluminescence layers, and the electron transport layer are formed by the ink jet method, a high definition electroluminescence device can be manufactured.

The invention consisting of the above constitution will be explained more in detail according to Embodiments to be described below.

Embodiments

First Embodiment

In this Embodiment, an example in which a full-color display panel is manufactured will be described.

A procedure for carrying a substrate, on which an anode (first electrode) and an insulator (partition wall) covering an end of the anode are provided in advance, into the apparatus for forming films shown in FIG. 4 and manufacturing an electroluminescence device will be hereinafter described. Note that, in the case in which an electroluminescence device of an active matrix type is manufactured, a thin film transistor connected to the anode (TFT for current control) and plural other thin film transistors (TFT for switching, etc.) are provided on a substrate in advance, and a drive circuit consisting of thin film transistors is also provided. In addition, in the case in which an electroluminescence device of a passive matrix type is manufactured, it is also possible to manufacture the electroluminescence device with the apparatus for forming films shown in FIG. 4.

First, the substrate (600 mm×720 mm) is set in a substrate introducing chamber 520. As a substrate size, it is possible to cope with a large area substrate like 320 mm×400 mm, 370 mm×470 mm, 550 mm×650 mm, 600 mm×720 mm, 680 mm×880 mm, 1000 mm×1200 mm, 1100 mm×1250 mm, and 1150 mm×1300 mm.

The substrate (the substrate provided with an anode and an insulator covering an end of the anode) set in the substrate introducing chamber 520 is conveyed to a conveyance chamber 518 maintained at atmospheric pressure. Note that a conveying mechanism (conveyance robot, etc.) for conveying and reversing the substrate is provided in the conveyance chamber 518.

The robot provided in the conveyance chamber 518 can reverse the front and the back of the substrate and can carry the substrate into a delivery chamber 505 in a reversed state. The delivery chamber 505 is connected to an evacuation and exhaust treatment chamber and can be made vacuum by being evacuated and exhausted and can be pressurized to the atmospheric pressure by introducing an inert gas after being evacuated and exhausted.

The evacuation and exhaust treatment chamber is provided with a turbo-molecular pump of a magnetically levitated type, a cryopump, or a dry pump. The same pump is also provided in conveyance chambers 502, 508, and 514, whereby it is possible to set an ultimate pressure in the conveyance chambers 502, 508, and 514 connected to respective chambers to $10^{-5}$ to $10^{-6}$ Pa. Moreover, back diffusion of impurities from the pump side and an exhaust system can be controlled. In order to prevent impurities from being introduced into the device, inert gases such as nitrogen or rare gas are used as a gas to be introduced. As these gases to be introduced into the device, gases highly purified by a gas purifier before being introduced into the device are used. Therefore, it is necessary to provide a gas purifier such that a gas is introduced into the evaporation device after being highly purified. Consequently, since oxygen, water, and other impurities contained in the gas can be removed in advance, these impurities can be prevented from being introduced into the device. In addition, it is preferable to clean the surface of the first electrode (anode) with a porous sponge (representatively, a sponge made of PVA (polyvinyl alcohol) or nylon) containing a surface active agent (alkalescence) to remove dusts on the surface before setting the substrate in the substrate introducing chamber 520 in order to reduce point defects that are pixels for which light emission control is not performed by an input signal in a display. As a cleaning mechanism, a cleaning device having a roll brush (made of PVA), which rotates around an axis parallel to the surface of the substrate and comes into contact with the surface of the substrate, may be used, or a cleaning device having a disk brush (made of PVA), which comes into contact with the surface of the substrate while rotating around an axis perpendicular to the surface of the substrate, may be used.

Subsequently, the substrate is conveyed from the conveyance chamber 518 to the delivery chamber 505 and is further conveyed from the delivery chamber 505 to the conveyance chamber 502 without being exposed to the atmosphere.

In addition, in order to remove shrinkage, it is preferable to perform heating under vacuum before evaporation of a film containing organic compounds. In order to convey the substrate from the conveyance chamber 502 to a multi-stage vacuum heating chamber 521 and thoroughly remove moisture and the other gases contained in the substrate, annealing for degassing is performed in the vacuum ($5 \times 10^{-3}$ Torr (0.665 Pa) or less, preferably $10^{-4}$ to $10^{-6}$ Torr). In the multi-stage vacuum heating chamber 521, plural substrates are heated uniformly using a flat heater (representatively, a sheath heater). A plurality of the flat heaters are set, and the substrate can be heated from both sides as if the substrate is nipped by the flat heaters. It is needless to mention that the substrate can be heated from one side. In particular, in the case in which an organic resin film is used as a material for the interlayer insulating film and the partition wall, the organic resin film tends to absorb moisture depending upon an organic resin material, and it is likely that degassing occurs, it is effective to performing natural cooling for thirty minutes and perform heating under vacuum for removing absorbed moisture after performing heating for, for example, thirty minutes or more at 100° C. to 250° C., preferably 150° C. to 200° C. before forming the layer containing organic compounds.

In addition to the heating under vacuum, UV may be irradiated while performing heating at 200 to 250° C. in the inert gas atmosphere. In addition, it is sufficient to only perform processing for irradiating UV while performing heating at 200 to 250° C. in the inert gas atmosphere without performing the heating under vacuum. If necessary, a hole injection layer consisting of a polymeric material may be formed by the ink jet method, the spin coat method, or the spray method under the atmospheric pressure or decompression in the film formation chamber 512. Uniformity of film thickness may be realized by a spin coater after applying the material with the ink jet method. Similarly, uniformity of film thickness may be realized by the spin coater after applying the material with the spray method. In addition, the substrate may be placed lengthwise to form a film with the ink jet method in the vacuum.

For example, poly (ethylene dioxythiophene)/poly (styrene sulfonic acid) water solution (PEDOT/PSS), polyaniline/camphorsulfonic acid water solution (PANI/CSA), PTPDES, Et-PTPDEK, PPBA, or the like, which acts as a hole injection layer (anode buffer layer) may be applied to the entire surface on the first electrode (anode) and baked in the film formation chamber 512. In the baking, it is preferable to perform the baking in multi-stage heating chambers 523a and 523b.

In the case in which a hole injection layer (HIL) consisting of a polymeric material is formed by the application method using spin coat or the like, planarity is improved, and coverage and uniformity of thickness of a film formed on the hole injection layer can be made satisfactory. In particular, since thickness of the electroluminescence layer is made uniform, uniform light emission can be obtained. In this case, after forming the hole injection layer with the application method, it is preferable to perform heating under the atmospheric pressure or heating under vacuum (100 to 200° C.) immediately before the film formation by the evaporation method.

For example, after cleaning a surface of a first electrode (anode) with a sponge, after carrying the substrate into the substrate introducing chamber 520, conveying the substrate to the film formation chamber 512a, and applying poly (ethylene dioxythiophene)/poly (styrene sulfonic acid) water solution (PEDOT/PSS) over the entire surface with a thickness of 60 nm by the spin coat method, and after conveying the substrate to the multi-stage heating chambers 523a and 523b and subjecting the substrate to preliminary baking for ten minutes at 80° C. and main baking for one hour at 200° C., and conveying the substrate to the multi-stage vacuum heating chamber 521 and subjecting the substrate to heating under vacuum (170° C., heating for thirty minutes, cooling for thirty minutes) immediately before evaporation, the substrate only has to be conveyed to a film formation chamber 506H of a hole transport layer, a film formation chamber 506RGB of an electroluminescence layer, and a film formation chamber 506E of an electron transport layer to form a layer containing organic compounds with the evaporation method without being exposed to the atmosphere. In particular, in the case in which an ITO film is used as an anode material and unevenness and fine particles are present on a surface thereof, influence of these unevenness and fine particles can be reduced by setting the thickness of PEDOT/PSS to 30 nm or more. In addition, in order to improve a leaking property of PEDOT/PSS, it is preferable to irradiate ultraviolet rays in a UV treatment chamber 531.

In addition, in the case in which a film of PEDOT/PSS is formed by the spin coat method, since the film is formed on the entire surface, it is preferable to remove the film on an end face of the substrate and in a peripheral part, a terminal part, a cathode, a connection area with a lower wiring, and the like in a selective manner, and it is preferable to remove the film by $O_2$ ashing or the like using a mask in a selective manner in a pre-treatment chamber 503. The pre-treatment chamber 503 has plasma generating means and excites one or plural kinds of gas selected out of Ar, H, F, and O to generate plasma to thereby perform dry etching. By using the mask, only unnecessary parts can be removed in a selective manner. Note that an evaporation mask is stocked in mask stock chambers 524a and 524b and conveyed to the respective film formation chambers 506H, 506RGB, and 506H according to circumstances when evaporation is performed. Since an area of the mask is increased if a large substrate is used, a size of a frame for fixing the mask is increased to make it difficult to stock many masks. Thus, the two mask stock chambers 524a and 524b are prepared here. Cleaning of the evaporation mask may be performed in the mask stock chambers 524a and 524b. In addition, since the mask stock chambers become empty at the time of evaporation, it is possible to stock a substrate after film formation or after treatment in the mask stock chambers.

Subsequently, the substrate is conveyed from the conveyance chamber 502 to a delivery chamber 507 and further conveyed from the delivery chamber 507 to the conveyance chamber 508 without being exposed to the atmosphere.

Subsequently, the substrate is conveyed to the respective film formation chambers 506H, 506RGB, and 506E connected to the conveyance chamber 508 appropriately to form a layer containing organic compounds, which consists of a monomeric material, to be a hole transport layer, an electroluminescence layer, and an electron transport layer appropriately. Installation chambers 526h and 526e for setting an evaporation material in an evaporation holder are provided in the film formation chamber 506H of the hole transport layer and the film formation chamber 506E of the electron transport layer, respectively. In addition, three installation chambers 526r, 526g, and 526b are provided in the film formation chamber 506RGB of the electroluminescence layer, and the evaporation device shown in FIG. 1 of the First Embodiment Mode is applied. By selecting an EL material, which is a material for the electroluminescence layer, is selected appropriately using a mask, an electroluminescence element showing light emission of three kinds of colors (specifically, R, G, and B) as the electroluminescence element as a whole can be formed.

Subsequently, the substrate is conveyed to a film formation chamber 510 by a conveying mechanism set in the conveying chamber 514 to form a cathode. It is preferable that this cathode is transparent or translucent. It is preferable to use a thin film (1 nm to 10 nm) of a metal film (alloy such as MgAg, MgIn, $CaF_2$, LiF, or CaN, or film formed of an element belonging to first group or second group in a periodic table and aluminum by a co-evaporation method, or a laminated film of these films) formed by the evaporation method using resistance heating or a lamination of the thin film (1 nm to 10 nm) of the metal film and a transparent conductive film as a cathode. In addition, after conveying the substrate to the conveyance chamber 514 from the conveyance chamber 508 through a delivery chamber 511, the substrate is conveyed to a film formation chamber 509, and a transparent conductive film is formed using the sputtering method.

The electroluminescence element of the lamination structure having the layer containing organic compounds is formed by the above process. In addition, the substrate may be conveyed to a film formation chamber 513 connected to the conveyance chamber 514 and sealed by forming a protective film consisting of a silicon nitride film or a silicon nitride oxide film. Here, a target consisting of silicon, a target consisting of silicon oxide, or a target consisting of silicon nitride is provided in the film formation chamber 513.

A bar-like target may be moved to a fixed substrate to form a protective film. In addition, a protective film may be formed by moving a substrate to a fixed bar-like target.

For example, a silicon nitride film can be formed on a cathode by changing a film formation chamber atmosphere to a nitrogen atmosphere or an atmosphere containing nitrogen and argon using a disc-like target consisting of silicon. In addition, a thin film containing carbon as a main component (a diamond-like carbon film (DLC film), a carbon nanotube film (CN film), or an amorphous carbon film) may be formed as a protective film, and a film formation chamber using the CVD method may be provided separately. The diamond-like carbon film (DLC film) can be formed by a plasma CVD method (representatively, an RF plasma CVD method, a microwave CVD method, an electron cyclotron resonance (ECR) CVD method, a hot filament method, etc.), a combustion flame method, a sputtering method, an ion beam evaporation method, a laser evaporation method, and the like. As a reactive gas to be used for film formation, a hydrogen gas and a hydrocarbon gas (e.g., $CH_4$, $C_2H_2$, $C_6H_6$, etc.) are used. The gas is ionized by glow discharge, and ions are accelerated to collide against a cathode, to which a negative self-bias is applied, to form a film. In addition, the carbon nanotube film (CN film) only has to be formed using a $C_2H_4$ gas and an $N_2$ gas as a reactive gas. Note that the diamond-like carbon film (DLC film) and the carbon nanotube film (CN film) are insulating films that are transparent or translucent with respect to visible light. Transparency with respect to visible light means that a transmittance of visible light is 80 to 100%, and translucency with respect to visible light means that a transmittance of visible light is 50 to 80%.

In addition, instead of the protective layer, a protective film consisting of a lamination of a first inorganic insulating film, a stress relief film, and a second inorganic insulating film may be formed on a cathode. For example, after forming the cathode, it is sufficient to convey the substrate to the film formation chamber 513 to form the first inorganic insulating film with a thickness of 5 nm to 50 nm, convey the substrate to the film formation chamber 513 to form the stress relief film (an inorganic layer, an organic compound layer, etc.) having moisture absorption and transparency with a thickness of 10 nm to 100 nm with the evaporation method, and convey the substrate to the film formation chamber 513 again to form the second inorganic insulating film with a thickness of 5 nm to 50 nm.

Subsequently, the substrate with the electroluminescence element formed thereon is conveyed to a sealing chamber 519.

A sealing substrate is set in a load chamber 517 from the outside and prepared. The sealing substrate is conveyed from the load chamber 517 to a conveyance chamber 527, and if necessary, conveyed to an optical film adhesion chamber 529 for sticking a drying agent and an optical filter (a color filter, a polarized film, etc.). In addition, a sealing substrate, to which an optical film (a color filter, a polarized plate) is stuck in advance, may be set in the load chamber 517.

Note that it is preferable to perform annealing in a multi-stage heating chamber 516 in advance in order to remove impurities such as moisture in the sealing substrate. Then, in the case in which a seal material for sticking the sealing substrate to the substrate provided with the electroluminescence element is formed in the sealing substrate, the sealing substrate is conveyed to the conveyance chamber 514 through a delivery chamber 542 and set in an ink jet chamber 515. A first seal material surrounding a pixel portion is formed by an ink jet device (or dispense device) under decompression, and a second seal material for filling an area surrounded by the first seal material is dripped. Since the detailed explanation of the ink jet chamber 515 is made in the Second Embodiment Mode, the explanation is omitted here. In addition, an auxiliary wiring may be manufactured on a cathode consisting of a transparent conductive film with the ink jet device using a nano-metal ink or the like. If baking is necessary, the sealing substrate only has to be conveyed to the multi-stage heating chamber 516 and heated.

Then, the sealing substrate, on which the seal material is formed, is further conveyed to a sealing substrate stock chamber 530. Note that, although an example in which the seal member is formed on the sealing substrate is described here, the invention is not specifically limited, and a seal material may be formed on a substrate on which an electroluminescence element is formed. In addition, an evaporation mask, which is used at the time of evaporation, may be stocked in the sealing substrate stock chamber 530.

Note that, since this Embodiment is the case of a both-side exiting structure, the sealing substrate only has to be conveyed to the optical film adhesion chamber 529 to stick an optical film on the inner side of the sealing substrate. Alternatively, after the substrate provided with the electroluminescence element and the sealing substrate are stuck, the sealing substrate only has to be conveyed to the optical film adhesion chamber 529 to stick an optical film (a color film or a polarized plate) on the outer side of the sealing substrate.

Subsequently, the substrate and the sealing substrate are stuck in the sealing chamber 519, and UV rays are irradiated on the stuck pair of substrates by an ultraviolet ray irradiating mechanism provided in the sealing chamber 519 to harden the seal material. It is preferable to irradiate UV rays from the sealing substrate side where a TFT, which blocks light, is not provided. Note that, although ultraviolet curing or thermoset resin is used as the seal material here, the seal material is not specifically limited as long as the seal material is an adhesive, and cured resin or the like, which hardens only with ultraviolet rays, may be used.

In the case in which ultraviolet rays are irradiated from the sealing substrate side in the case of the both-side exiting type, it is preferable not to use ultraviolet curing resin because ultraviolet rays pass through the cathode to damage the layer containing organic compounds. Therefore, in the case of the both-side exiting type in this embodiment, it is preferable to use thermosetting transparent resin as resin to be filled.

Subsequently, the stuck pair of substrates are conveyed from the sealing chamber 519 to the conveying chamber 514 and from the conveyance chamber 527 to a removal chamber 525 through the delivery chamber 542 and removed.

In addition, after the substrates are removed from the removal chamber 525, the substrates are heated to harden the seal material. In the case in which a panel structure is the top emittion type and thermoset resin is filled, the thermoset resin can be hardened simultaneously with heating treatment for hardening the seal material.

As described above, the electroluminescence element is not exposed to the atmosphere until the electroluminescence element is enclosed in a closed space completely by using the apparatus for forming a film shown in FIG. 4, it becomes possible to manufacture a highly reliable electroluminescence device.

Note that, although not shown in the figure here, a control device for controlling a path, on which a substrate is moved to the respective treatment chambers, to realize full automation is provided.

In addition, this Embodiment can be combined with any one of the First to the Fourth Embodiment Modes freely.

Second Embodiment

Figure 12A:
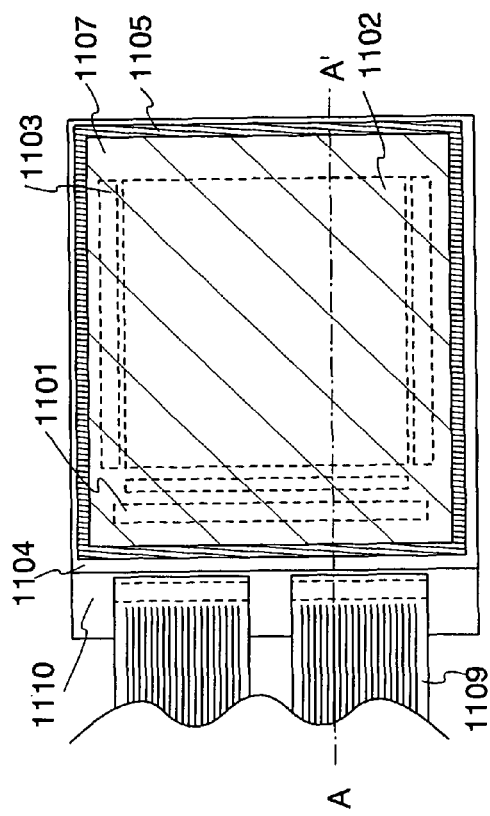
FIGS. 12A and 12B are a top view and a sectional view showing an electroluminescence device of the invention. (Second Embodiment)
Figure 12B:
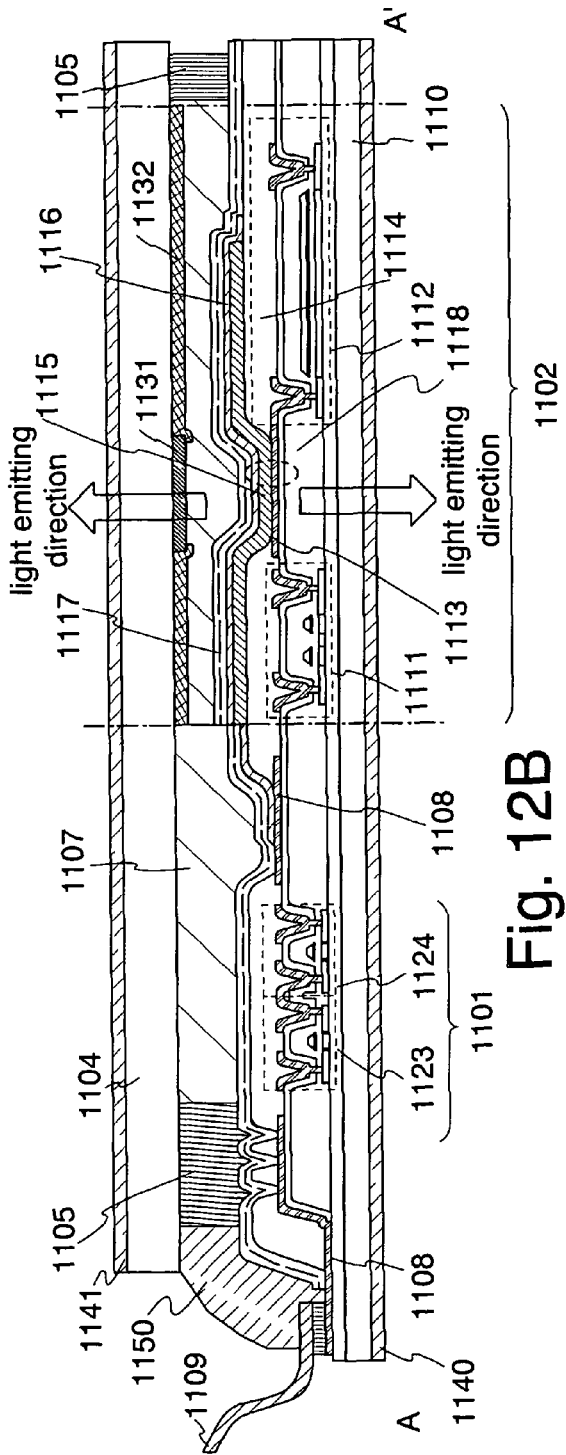

In the present Embodiment, an example of fabricating a light-emitting device (double-side emission structure) comprising a light-emitting element employing an organic compound layer as a light-emitting layer on a substrate having an insulated surface is shown in FIGS. 12A and 12B.

Further, FIG. 12A is a top view of the light-emitting device, FIG. 12B is a cross-sectional view obtained by cutting FIG. 12A along A-A'. The reference numeral 1101 stands for a source signal line drive circuit (shown by a dot line), 1102—an image unit, 1103—a gate signal line drive circuit. Further, the reference numeral 1104 stands for a transparent sealing substrate and 1105—a first sealing material. The space surrounded by the first sealing material 1105 is filled with a transparent second sealing material 1107. The first sealing material 1105 comprises a gap material for maintaining the substrate clearance.

Further, the reference numeral 1108 stands for a wiring for transmitting signals input into the source signal line drive circuit 1101 and gate signal line drive circuit 1103. It receives a video signal or clock signal from a FPC (flexible printed circuit) 1109 serving as an external input terminal. Here, only the FPC is shown, but a printed wiring board (PWB) may be mounted on the FPC. Also, a resin 1150 is provided so as to surround the FPC 1109.

The cross-sectional configuration will be explained below by using FIG. 12B. A drive circuit and a pixel portion are formed on a transparent substrate 1110. Here, the source signal line drive circuit 1101 as the drive circuit and the pixel portion 1102 are shown.

A CMOS circuit combining an n-channel TFT 1123 and a p-channel TFT 1124 is formed as the source signal line drive circuit 1101. The TFTs forming the drive circuit may be formed from a well-known CMOS circuit, PMOS circuit, or NMOS circuit. Furthermore, in the present example, a driver-unified configuration is shown in which the drive circuit is formed on the substrate, but such a configuration is not always necessary and the drive circuit can be formed on the outside, rather than on the substrate. Further, the structure of a TFT in which a polysilicon film or amorphous silicon film serves as an active layer is not particularly limiting, and a top-gate TFT or a bottom-gate TFT may be used.

Further, the pixel portion 1102 is composed of a plurality of pixels comprising a TFT 1111 for switching, a TFT 1112 for current control, and a first electrode (anode) 113 electrically connected to the drain thereof. An n-channel TFT or a p-channel TFT may be used as the TFT 1112 for current control, but when connection is made to the anode, the p-channel TFT is preferably used. Further, it is preferred that an appropriate holding capacitance (not shown in the Figure) be provided. Here, only the cross-sectional structure of one pixel of an extremely large number of pixels is shown and an example is shown in which two TFTs were used for this one pixel, but three or more TFTs may be used appropriately.

In this configuration the first electrode 1113 is directly connected to the drain of TFT. Therefore, it is preferred that the lower layer of the first electrode 1113 be a material layer providing for ohmic contact with the drain composed of silicon and that the uppermost layer which is in contact with the layer containing an organic compound be a material layer with a large work function. For example, a transparent conductive film (ITO (indium oxide tin alloy), indium oxide zinc oxide alloy ($In_2O_3$—ZnO), zinc oxide (ZnO), and the like) is used.

Further, an insulator (called a bank, a partition wall, a separating wall, an embankment, and the like) 1114 is formed at both ends of the first electrode (anode) 1113. The insulator 1114 may be formed from an organic resin film or an insulating film containing silicon. Here, an insulator of the shape shown in FIG. 12B is formed as the insulator 1114 by using a positive-type photosensitive acrylic resin film.

A curved surface having a curvature is formed at the upper end portion or lower end portion of the insulator 1114 in order to improve coverage of a layer containing an organic compound, which will be formed on the insulator 1114. For example, when a positive-type photosensitive acryl is used as the material of the insulator 1114, it is preferred that the curved surface having a curvature radius (0.2 μm -3 μm) be provided only at the upper end portion of the insulator 1114. Furthermore, either negative-type photosensitive compositions that are made insoluble in an enchant under light or positive-type compositions that are made soluble in an etchant under light can be used as the insulator 1114.

Further, the insulator 1114 may be covered with a protective film composed of an aluminum nitride film, an aluminum nitride oxide film, a thin film containing carbon as the main component, or a silicon nitride film.

Further, a layer 1115 comprising an organic compound is selectively formed by a deposition method on the first electrode (anode) 1113. In the present example, the layer 1115 comprising an organic compound is formed in the production apparatus described in the Second Embodiment Mode and a uniform film thickness is obtained. Furthermore, a second electrode (cathode) 1116 is formed on the layer comprising an organic compound 1115. A material with a low work function (Al, Ag, Li, Ca, alloys thereof, MgAg, MgIn, AlLi, $CaF_2$, or CaN) may be used for the cathode. Here, in order to pass the emitted light, a laminated layer of a thin metal film (MgAg: film thickness 10 nm) with a decreased film thickness and a transparent electrically conductive film (ITO (indium oxide tin oxide alloy) with a film thickness of 110 nm, an indium oxide zinc oxide alloy ($In_2O_3$—ZnO), zinc oxide (ZnO), and the like) is used as the second electrode (cathode) 1116. A light-emitting element 1118 composed of the first electrode (anode) 1113, the layer 1115 comprising an organic compound, and a second electrode (cathode) 1116 is thus formed. In the present example, white emitted light is obtained by use of a layer comprising an organic compounds 1115 formed by successively laminating CuPc (film thickness 20 nm), α-NPD (film thickness 30 nm), CBP (film thickness 30 nm) comprising an organometallic complex comprising platinum as a central metal (Pt (ppy)acac), BCP (film thickness 20 nm), and BCP:Li (film thickness 40 nm). This example is an example in which the light-emitting element 1118 emits white light. Therefore, a color filter (here, for the sake of simplicity, the overcoat is not shown in the Figure) composed of a coloration layer 1131 and a light-shielding layer (BM) 1132 is provided.

Further, in such dual-side light-emission display device, optical films 1140 and 1141 are provided in order to prevent the background from penetration and to prevent the external light reflection. A polarizing film (a polarizing plate of a high transmittance type, a thin light polarizing plate, a white light polarizing plate, a polarizing plate comprising high-performance dyes, an AR polarizing plate, and the like), a phase-difference film (a broadband ¼λ plate, a temperature-compensated phase-difference film, a twisted phase-difference film, a phase-difference film with a wide viewing angle, a biaxially oriented phase-difference film, and the like), and a luminosity-increasing film may be used in an appropriate combination as the optical films 1140 and 1141. For example, if polarizing films are used as the optical films 1140 and 1141 and arranged so that the light polarization directions are orthogonal to each other, it is possible to obtain an effect of preventing the penetration of background and an effect of preventing the reflection. In this case, zones, which is outside the portions where light is emitted and display is conducted, become black and the background can be prevented from penetrating and being seen even when the display is viewed from any side. Further, because the emitted light from the light-emitting panel passes only through one polarizing plate, it is displayed as is.

The same effects as described hereinabove can be obtained in case that even if the two polarizing films are not orthogonal, the light polarization directions are within an angle of ±45°, preferably, within ±20° with respect to each other.

With the optical films 1140, 1141, it is possible to prevent the background from penetrating to become visible and making it difficult to recognize the display when a person views the display from one surface.

Further, one more optical film may be added. For example, one polarizing film absorbs S waves (or P waves), but a luminosity increasing film for reflecting S waves (or P waves) onto the light-emitting elements and reproducing them may be provided between the polarizing plate and light-emitting panel. As a result, the amount of P waves (or S waves) that pass through the polarizing plate increases and the increase in integral quantity of light can be obtained. In the dual-side light-emitting panels, the structures of layers that pass the light from the light-emitting elements are different. Therefore, the light emission patterns (luminosity, chromaticity balance, and the like) are different and the optical films are suitable for adjusting the light emission balance on both sides. Further, in the dual-side light-emitting panels, the external light reflection intensities are also different. Therefore, it is preferred that the luminosity increasing film be provided between the polarizing plate and light-emitting panel on the surface with a larger reflection.

Further, a transparent protective laminated layer 1117 is formed for sealing the light-emitting element 1118. The transparent protective laminated layer 1117 is composed of a laminated layer of a first inorganic insulating film, a stress relaxation film, and a second inorganic insulating film. A silicon nitride film, silicon oxide film, silicon oxide nitride film (SiNO film (composition ratio N>O), a SiON film (composition ratio N<O)), or a thin film containing carbon as the main component (for example, a DLC film, a CN film) obtained by a sputtering method or a CVD method can be used as the first inorganic insulating film and second inorganic insulating film. Those inorganic insulating films have a strong blocking effect with respect to moisture, but if the film thickness increases, the film stresses increase and the film can be easily peeled or detached. However, stresses can be relaxed and moisture can be absorbed by sandwiching a stress relaxation film between the first inorganic insulating film and second inorganic insulating film. Further, even when fine holes (pinholes and the like) are formed for whatever reason in the first inorganic insulating film during deposition, they are filled with the stress relaxation film. Further, providing the second inorganic insulating film thereupon produces a very strong blocking effect with respect to moisture or oxygen. Further a hygroscopic material with stresses less than those in the inorganic insulating films is preferred as the stress relaxation film. Moreover, a transparent material is preferred. Further, material films comprising organic compounds such as α-NPD (4,4'-bis-[N-(naphthyl)-N-phenyl-amino]biphenyl), BCP (bathocuproine), MTDATA (4,4',4"-tris(N-3-methylphenyl-N-phenyl-amino)triphenylamine), $Alq_3$ (tris-8-quinolinolatoaluminum complex) maybe used as the stress relaxation film. Those material films have hygroscopicity and are almost transparent if the film thickness is small. Furthermore, because MgO, $SrO_2$, and SrO have hygroscopicity and light transparency and thin films thereof can be obtained by a deposition method, they can be used for the stress relaxation film. In the present example, a film formed in an atmosphere comprising nitrogen and argon by using a silicon target, that is, a silicon nitride film with a strong blocking effect with respect to moisture and impurities such as alkali metals is used as a first inorganic insulating film or second inorganic insulating film, and a thin film of $Alq_3$ produced by a deposition method is used as the stress relaxation film. Further, in order to pass the emitted light to the transparent protective laminated layer, the total film thickness of the transparent protective laminated layer is preferably as small as possible.

Further, the sealing substrate 1104 is pasted with a first sealing material 1105 and a second sealing material 1107 under an inactive gas atmosphere in order to seal the light-emitting element 1118. An epoxy resin is preferably used as the first sealing material 1105. Further, no specific limitation is placed on the second sealing material 1107, provided it is a material transparent to light. Typically, it is preferred that a UV-curable or thermosetting epoxy resin be used. Here, a UV epoxy resin (manufactured by Electrolight Co., 1500Clear) with high heat resistance is used. This resin has a refractive index of 1.50, a viscosity of 500 cps, a Shore D hardness of 90, a tensile strength of 3000 psi, a Tg point of 150° C., a volume resistance of $1 \times 10^{15}$ Ω·cm, and a voltage resistance of 450 V/mil. Further, filling the space between a pair of substrates with the second sealing material 1107 makes it possible to increase the transmittance of the entire body with respect to that obtained when the space between the two substrates is empty (inactive gas). Further, it is preferred that the moisture or oxygen permeability of the first sealing material 1105 and second sealing material 1107 be as low as possible.

Further, in the present example, a plastic substrate composed of FRP (Fiberglass-Reinforced Plastics), PVF (polyvinyl fluoride), Mylar, polyesters, acryls, and the like, can be used besides a glass substrate or quartz substrate as the material constituting the sealing substrate 1104. Further, after the sealed substrate 1104 has been adhesively bonded by using the first sealing material 1105 and second sealing material 1107, sealing can be conducted with a third sealing material so as to cover the side surfaces (exposed surfaces).

Sealing the light-emitting element with the first sealing material 1105 and second sealing material 1107 in the above-described manner makes it possible to completely shield the light-emitting element from the outside and to prevent the penetration of substances, such as moisture or oxygen, that enhance the deterioration of the organic compound layer. Therefore, a light-emitting device with high reliability is obtained.

Further, when a light-emitting device of a top-side emission type is fabricated, the second electrode (cathode) is preferably a reflective metal film (chromium, titanium nitride, and the like). Furthermore, when a light-emitting device of a bottom-side emission type is fabricated, a metal film (film thickness 50 nm-200 nm) composed of Al, Ag, Li, Ca, alloys thereof, MgAg, MgIn, and AlLi is preferably used for the first electrode (anode).

This example can be freely combined with the First to Fourth Embodiment Modes and the First Embodiment.

Third Embodiment

In this Embodiment, an example of an electronic equipment provided with two or more display devices will be described with reference to FIGS. 13A to 13G. An electronic equipment equipped with an EL module can be completed by implementing the present invention. The following are examples of electronic equipment: video cameras, digital cameras, goggle type displays (head mounted displays), navigation systems, audio reproducing apparatuses (car audios, audio components, etc.), laptop computers, game machines, portable information terminals (mobile computers, cellular phones, portable game machines, electronic books, etc.), image reproducing apparatuses equipped with a recording medium (specifically, devices equipped with displays each of which is capable of playing a recording medium such as a digital versatile disk (DVD), and displaying the image thereof), and the like.

Figure 13A:
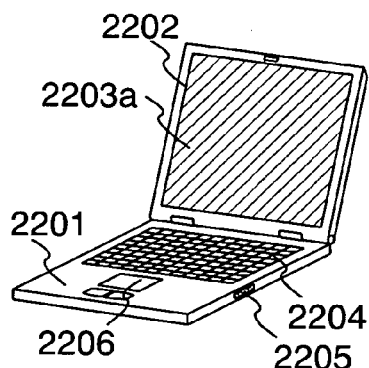
FIGS. 13A to 13G are diagrams showing examples of electronic devices. (Third Embodiment)
Figure 13B:
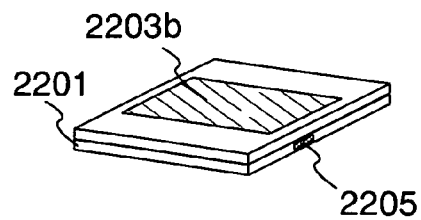
Figure 13C:
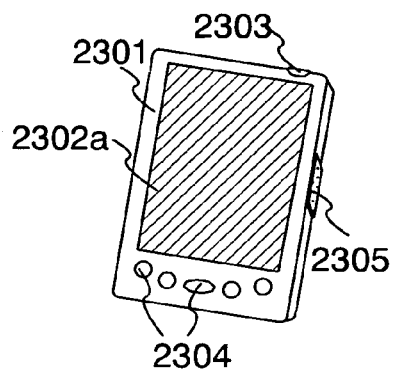
Figure 13D:
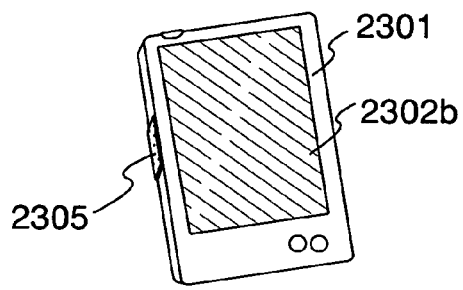
Figure 13E:
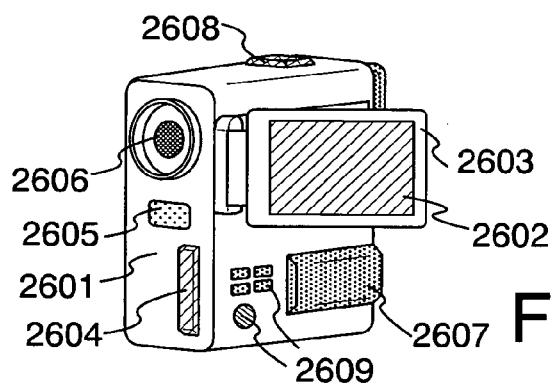
Figure 13F:
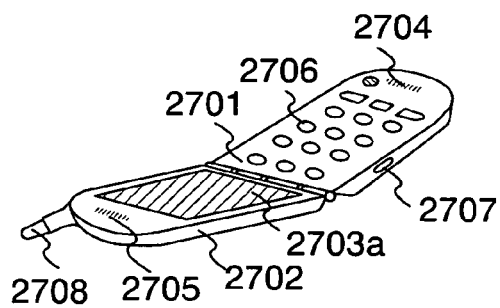
Figure 13G:
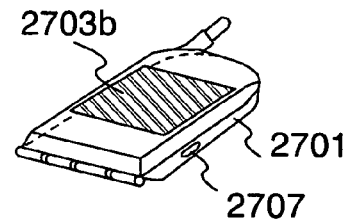

FIG. 13A is a perspective view showing a laptop computer, and FIG. 13B is also a perspective view showing a folded laptop computer. Each lap top computer comprises a main body 2201, a casing 2202, display portions 2203a and 2203b, a keyboard 2204, an external connection port 2205, a pointing mouse 2206, etc.

Fourth Embodiment

Figure 16:
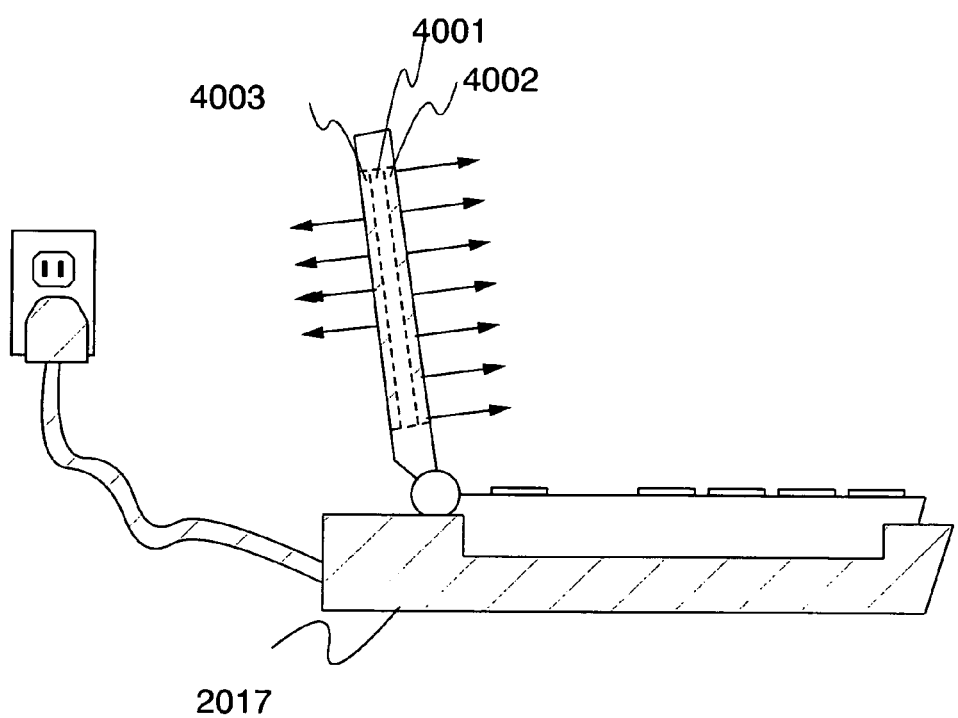
FIG. 16 shows a state in which the cellular phone using the electroluminescence device of the invention is being charged. (Fourth Embodiment)

FIG. 16 shows a diagram at the time when a cellular phone using the display device of the invention is charged using a charger 2017. In FIG. 16, light is emitted from both sides of the cellular phone in a state in which the cellular phone is opened. However, the cellular phone may be in a closed state.

Optical films 4002 and 4003 are provided on both sides of an electroluminescence panel 4001. As the optical films 4002 and 4003, a polarized film (a high-transmission type polarized plate, a thin polarized plate, a white polarized plate, a high-performance dye polarized film, an AR polarized film, etc.), a phase difference film (a wide band ¼λ plate, a temperature compensation phase difference film, a twist phase difference film, a wide visual angle phase difference film, a biaxial orientation phase difference film, etc.), a luminance improved film, and the like only has to be combined appropriately and used. For example, if polarized films are used as the optical films 4002 and 4003 and arranged such that polarizing directions of light are perpendicular to each other, an effect of preventing a background from being seen through and an effect of reflection prevention are obtained. In this case, parts other than parts that emit light and perform display are black, and a background cannot be seen through even if the display is seen from any side. In addition, light emitted from the electroluminescence panel passes through only one polarized plate, the light is displayed as it is. If two polarized plates are used in this way, transmittance of light can be reduced to 5% or less, and contrast of 100 or more can be attained.

In general, in a display device using an EL element, the EL element deteriorates with time, and luminance decreases. In particular, in the case of a display device in which EL elements are arranged in respective pixels, since a lighting frequency is different depending on a pixel, a degree of deterioration varies depending on a pixel. Therefore, a pixel with a higher lighting frequency deteriorates more severely to degrade an image quality as a image sticking phenomenon. Thus, by performing display at the time of charging or the like when the display device is not in a used state usually and lighting pixels with a low frequency of use, it becomes possible to make image sticking less conspicuous. As contents of display at the time of charging, full lighting, an image obtained by reversing bright and dark of a standard image (a waiting screen, etc.), an image to be displayed by detecting pixels with a low frequency of use, and the like.

Figure 14:
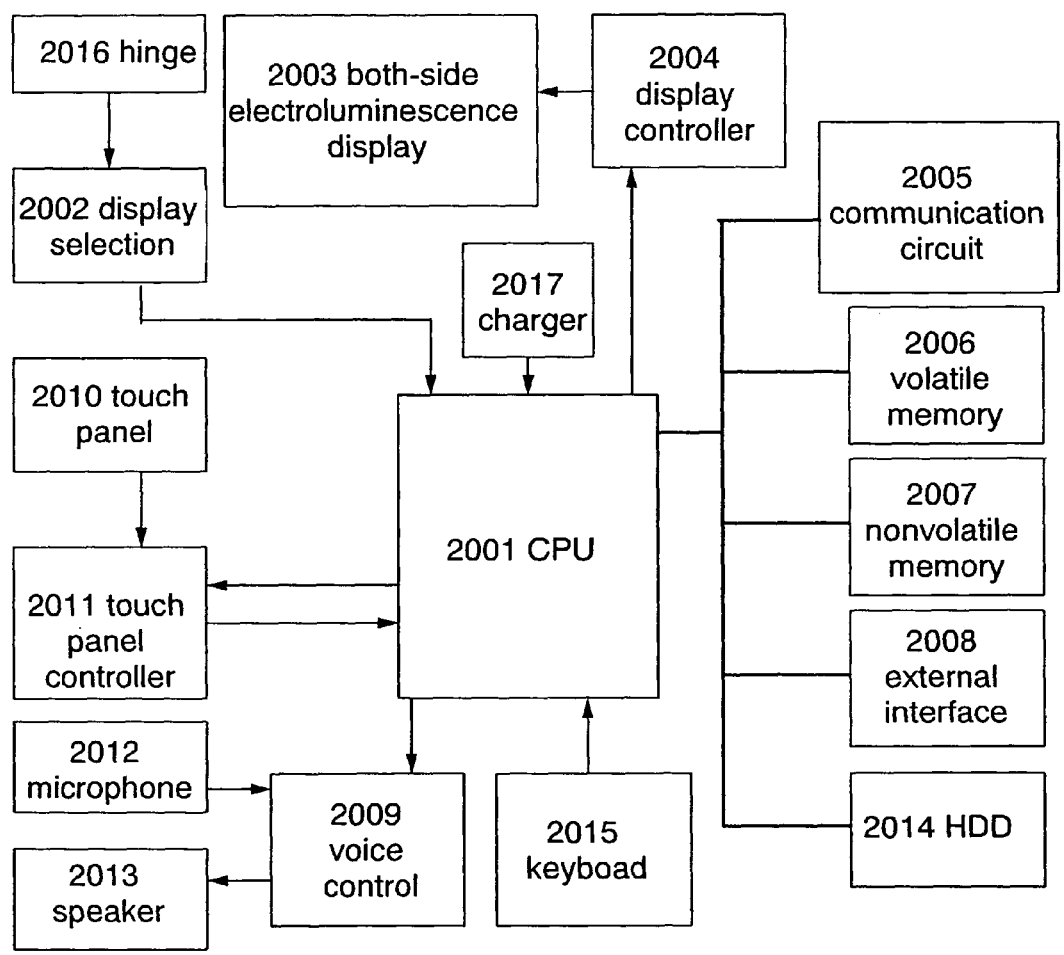
FIG. 14 is a block diagram of a cellular phone using the electroluminescence device of the invention. (Fourth Embodiment)

FIG. 14 is a block diagram corresponding to the cellular phone shown in FIG. 16. A CPU 2001 obtains a signal for detecting that the cellular phone has come into a charging state using a charger 2017 to thereby instruct a display controller 2004 to display a signal corresponding to the above, and a both-side electroluminescence display 2003 performs light emission. Note that, other than this information, information 2002 on a side of the both-side electroluminescence display 2003 on which display is performed determined from opening and closing of a hinge 2016, information input to a touch panel controller 2011 from a touch panel 2010, information on a voice control 2009 using a microphone 2012 and a speaker 2013, information from a keyboard 2015, and the like are input to the CPU. The CPU is provided with a communication circuit 2005, a volatile memory 2006, a nonvolatile memory 2007, an external interface 2008, a HDD 2014, and the like.

Figure 15:
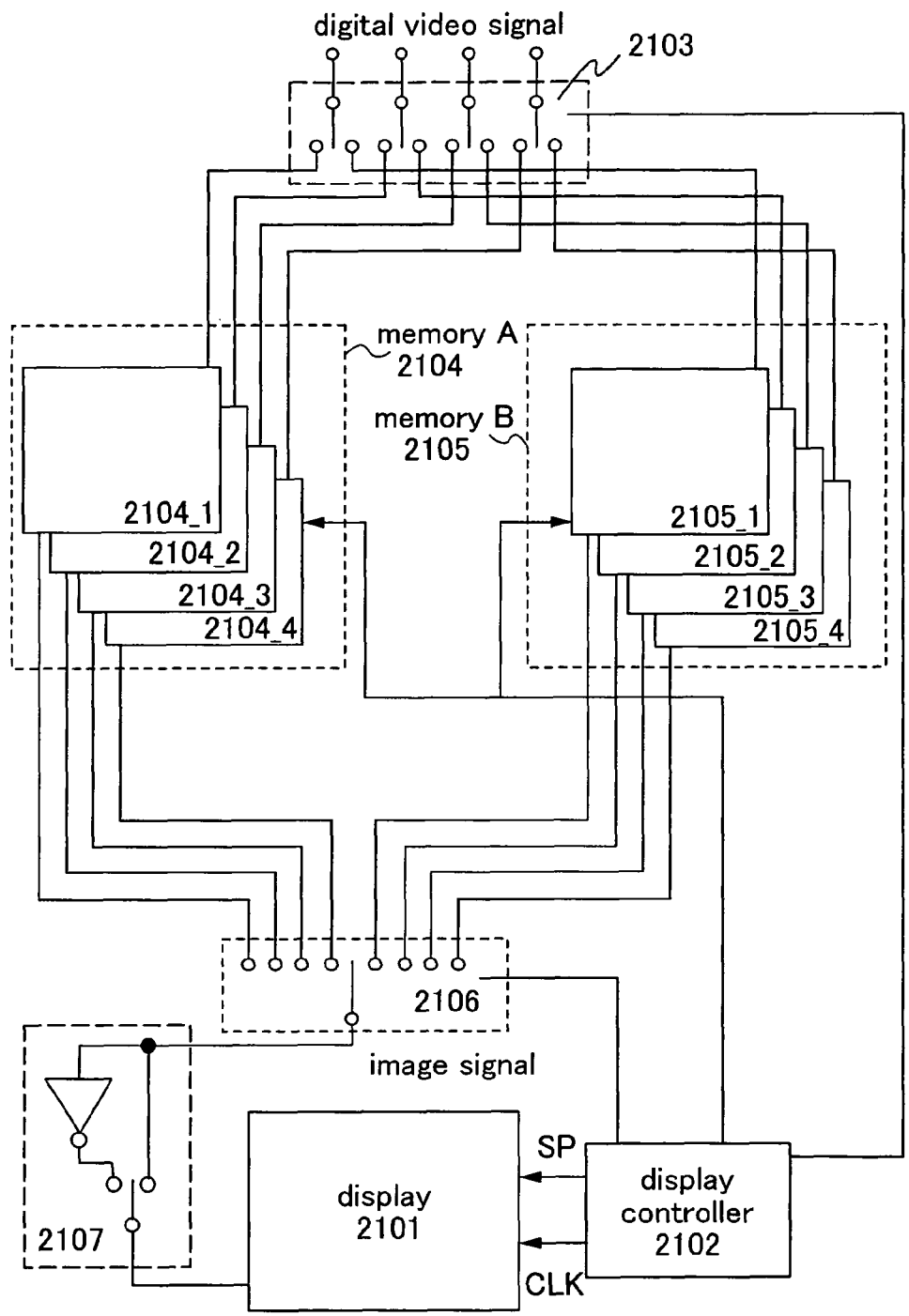
FIG. 15 is an explanatory diagram of creation of a reverse signal for the electroluminescence device of the invention. (Fourth Embodiment)

FIG. 15 is an example of means for creating the image obtained by reversing bright and dark of the standard signal (a waiting screen, etc.). A digital video signal of the standard signal (a waiting screen, etc.) is stored in a memory A 2104 having sub-memories 2104_1 to 2104_4 or a memory B 2105 having sub-memories 2105_1 to 2105_4 by a switch 2103. An output of a video signal selection switch 2106 is input to a switch 2107, and it can be chosen whether a signal of the switch 2106 is input to a display 2101 directly or reversed to be input. In the case in which reversal of bright and dark is necessary, the signal only has to be reversed and input. This choice is performed by the display controller 2102. In addition, in the case in which full lighting is performed, a fixed voltage only has to be input to the display 2101.

In this way, light emission for reducing image sticking is performed during charging, whereby deterioration of a display image quality can be controlled.

In addition, it is possible to combine this Embodiment with one of the First to the Fourth Embodiment modes and the First to the Third Embodiments freely.

Advantages of the Invention

According to the invention, manufacturing cost is reduced by increasing efficiency of use of a material forming a layer containing an organic compound, and an apparatus for forming a film provided with an evaporation device, which is one of apparatuses for forming a film excellent in uniformity and throughput in formation of the layer containing organic compounds, can be realized.

In addition, in the case in which a full-color electroluminescence device is manufactured, it is necessary to perform selective evaporation of an electroluminescence layer precisely. However, by adopting a structure in which parts of electroluminescence layers may overlap, further reduction in a size of a partition wall can be performed, which can be led to improvement of an aperture ratio.

The invention claimed is:

1. An apparatus for forming a film comprising:
a load chamber;
a conveyance chamber connected to the load chamber;
a film formation chamber connected to the conveyance chamber; and
an installation chamber connected to the film formation chamber, and comprising means adapted to move a first evaporation source, means adapted to move a second evaporation source, and means adapted to move a third evaporation source,
wherein at least one of the first, second and third evaporation sources includes a first container and a second container,
wherein each of the first container and the second container comprises a guide portion having an opening,
wherein an inclination of the first container is the same as an inclination of the second container,
wherein an inclination of the guide portion of the first container is different from an inclination of the guide portion of the second container, such that a direction of the opening of the first container is different from that of the second container, and
wherein each of the means adapted to move the first, second, and third evaporation sources is configured to move in an X direction, a Y direction, and a Z direction in the film formation chamber.

2. The apparatus for forming the film according to claim 1, wherein the installation chamber is connected to evacuating and exhausting means that evacuates the installation chamber.

3. The apparatus for forming the film according to claim 1, wherein the film formation chamber is connected to an evacuation and exhaust treatment chamber that evacuates the film forming chamber and has means for introducing at least one of a material gas and a cleaning gas.

4. The apparatus for forming the film according to claim 1, wherein the film formation chamber has a shutter that sections the film formation chamber and shields evaporation to the substrate.

5. The apparatus for forming the film according to claim 1,
wherein a sealing chamber is connected to the conveyance chamber, and
wherein the sealing chamber is connected to evacuating and exhausting means, which evacuates the sealing chamber, and has a mechanism for applying a seal material with an ink jet method in the sealing chamber.

6. The apparatus for forming the film according to claim 1, wherein the installation chamber further comprises a first installation chamber, a second installation chamber, and a third installation chamber, and wherein the means adapted to move the first evaporation source is provided in the first installation chamber, the means adapted to move the second evaporation source is provided in the second installation chamber, and the means adapted to move the third evaporation source is provided in the third installation chamber.

7. The apparatus for forming the film according to claim 1, wherein the installation chamber comprises a single installation chamber, and wherein the means adapted to move the first evaporation source, the means adapted to move the second evaporation source, and the means adapted to move the third evaporation source are provided in the single installation chamber.

8. The apparatus for forming the film according to claim 1,
wherein an evaporation is performed while at least one of the means adapted to move the first, second, and third evaporation sources moves in the film formation chamber.

9. An apparatus for forming a film comprising:
a load chamber;
a conveyance chamber connected to the load chamber;
a film formation chamber connected to the conveyance chamber; and
an installation chamber connected to the film formation chamber, and comprising means adapted to move a first evaporation source, means adapted to move a second evaporation source, and means adapted to move a third evaporation source,
wherein at least one of the first, second and third evaporation sources includes a first container and a second container,
wherein each of the first container and the second container comprises a guide portion having an opening,
wherein an inclination of the first container is the same as an inclination of the second container,
wherein an inclination of the guide portion of the first container is different from an inclination of the guide portion of the second container, such that a direction of the opening of the first container is different from that of the second container,
wherein the film formation chamber comprises an aligning means that aligns a mask and a substrate, and
wherein each of the means adapted to move the first, second, and third evaporation sources is configured to move in an X direction, a Y direction, and a Z direction in the film formation chamber.

10. The apparatus for forming the film according to claim 9,
wherein the installation chamber is connected to evacuating and exhausting means that evacuates the installation chamber.

11. The apparatus for forming the film according to claim 9,
  wherein the film formation chamber is connected to an evacuation and exhaust treatment chamber that evacuates the film forming chamber and has means for introducing at least one of a material gas and a cleaning gas.

12. The apparatus for forming the film according to claim 9,
  wherein the film formation chamber has a shutter that sections the film formation chamber and shields evaporation to the substrate.

13. The apparatus for forming the film according to claim 9,
  wherein a sealing chamber is connected to the conveyance chamber, and
  wherein the sealing chamber is connected to evacuating and exhausting means, which evacuates the sealing chamber, and has a mechanism for applying a seal material with an ink jet method in the sealing chamber.

14. The apparatus for forming the film according to claim 9, wherein the installation chamber further comprises a first installation chamber, a second installation chamber, and a third installation chamber, and wherein the means adapted to move the first evaporation source is provided in the first installation chamber, the means adapted to move the second evaporation source is provided in the second installation chamber, and the means adapted to move the third evaporation source is provided in the third installation chamber.

15. The apparatus for forming the film according to claim 9, wherein the installation chamber comprises a single installation chamber, and wherein the means adapted to move the first evaporation source, the means adapted to move the second evaporation source, and the means adapted to move the third evaporation source are provided in the single installation chamber.

16. The apparatus for forming the film according to claim 9,
  wherein an evaporation is performed while at least one of the means adapted to move the first, second, and third evaporation sources moves in the film formation chamber.

17. An apparatus for forming a film comprising:
  a load chamber;
  a conveyance chamber connected to the load chamber;
  a film formation chamber connected to the conveyance chamber; and
  an installation chamber connected to the film formation chamber, and comprising means adapted to move a first evaporation source, means adapted to move a second evaporation source, and means adapted to move a third evaporation source,
  wherein at least one of the first, second and third evaporation sources includes a first container and a second container,
  wherein each of the first container and the second container comprises a guide portion having an elliptical opening,
  wherein an inclination of the first container is the same as an inclination of the second container,
  wherein an inclination of the guide portion of the first container is different from an inclination of the guide portion of the second container, such that a direction of the elliptical opening of the first container is different from that of the second container, and
  wherein each of the means adapted to move the first, second, and third evaporation sources is configured to move in an X direction, a Y direction, and a Z direction in the film formation chamber.

18. The apparatus for forming the film according to claim 17,
  wherein the installation chamber is connected to evacuating and exhausting means that evacuates the installation chamber.

19. The apparatus for forming the film according to claim 17,
  wherein the film formation chamber is connected to an evacuation and exhaust treatment chamber that evacuates the film forming chamber and has means for introducing at least one of a material gas and a cleaning gas.

20. The apparatus for forming the film according to claim 17,
  wherein the film formation chamber has a shutter that sections the film formation chamber and shields evaporation to the substrate.

21. The apparatus for forming the film according to claim 17,
  wherein a sealing chamber is connected to the conveyance chamber, and
  wherein the sealing chamber is connected to evacuating and exhausting means, which evacuates the sealing chamber, and has a mechanism for applying a seal material with an ink jet method in the sealing chamber.

22. The apparatus for forming the film according to claim 17, wherein the installation chamber further comprises a first installation chamber, a second installation chamber, and a third installation chamber, and wherein the means adapted to move the first evaporation source is provided in the first installation chamber, the means adapted to move the second evaporation source is provided in the second installation chamber, and the means adapted to move the third evaporation source is provided in the third installation chamber.

23. The apparatus for forming the film according to claim 17, wherein the installation chamber comprises a single installation chamber, and wherein the means adapted to move the first evaporation source, the means adapted to move the second evaporation source, and the means adapted to move the third evaporation source are provided in the single installation chamber.

24. The apparatus for forming the film according to claim 17,
  wherein an evaporation is performed while at least one of the means adapted to move the first, second, and third evaporation sources moves in the film formation chamber.

* * * * *

UNITED STATES PATENT AND TRADEMARK OFFICE
CERTIFICATE OF CORRECTION

PATENT NO. : 8,034,182 B2
APPLICATION NO. : 10/826920
DATED : October 11, 2011
INVENTOR(S) : Shunpei Yamazaki It is certified that error appears in the above-identified patent and that said Letters Patent is hereby corrected as shown below:

Column 2, line 66, replace "aparat" with --apart--

Column 19, line 3, replace "forma" with --form a--

Column 19, line 7, replace "526efor" with --526e for--

Column 24, line 45, replace "maybe" with --may be--

Signed and Sealed this
Fifteenth Day of May, 2012

David J. Kappos
*Director of the United States Patent and Trademark Office*